US010133215B2

(12) United States Patent
Fukasawa et al.

(10) Patent No.: US 10,133,215 B2
(45) Date of Patent: Nov. 20, 2018

(54) DEVELOPER CONTAINER, DEVELOPER STORAGE UNIT, PROCESS CARTRIDGE, AND IMAGE FORMING APPARATUS

(71) Applicant: CANON KABUSHIKI KAISHA, Tokyo (JP)

(72) Inventors: Yu Fukasawa, Nagareyama (JP); Naoki Hayashi, Kawasaki (JP); Ryota Shibuya, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/693,610

(22) Filed: Sep. 1, 2017

(65) Prior Publication Data

US 2017/0363989 A1 Dec. 21, 2017

Related U.S. Application Data

(63) Continuation of application No. 14/827,374, filed on Aug. 17, 2015, now Pat. No. 9,785,091.

(30) Foreign Application Priority Data

Aug. 29, 2014 (JP) ................................ 2014-176129

(51) Int. Cl.
*G03G 15/08* (2006.01)

(52) U.S. Cl.
CPC ..... *G03G 15/0889* (2013.01); *G03G 15/0882* (2013.01); *H05K 999/99* (2013.01)

(58) Field of Classification Search
CPC .................................................. G03G 15/0889
(Continued)

(56) References Cited

U.S. PATENT DOCUMENTS 8,422,914 B2 4/2013 Hayashi et al.
9,128,417 B2 9/2015 Yamasaki et al.
(Continued)

FOREIGN PATENT DOCUMENTS

JP H05-197288 A 8/1993
JP 2002-278241 A 9/2002
(Continued)

OTHER PUBLICATIONS

English translation dated May 22, 2018 Office Action in Japanese Patent Application No. 2014-176129.
(Continued)

*Primary Examiner* — Walter L Lindsay, Jr.
*Assistant Examiner* — Philip Marcus T Fadul
(74) *Attorney, Agent, or Firm* — Fitzpatrick, Cella, Harper & Scinto

(57) ABSTRACT

A developer container includes a developer storage chamber that stores developer and includes an opening, a sealing member that seals the opening, an unsealing member that opens the opening by rotating such that the sealing member, a part of which is attached to the unsealing member, is peeled away, a stirring member that is attached to the unsealing member; and a regulating portion that regulates rotation of the unsealing member by contacting the stirring member. The regulating portion is provided to regulate the rotation of the unsealing member when the developer container receives an external force, and allow the unsealing member to rotate such that the opening is opened when the unsealing member receives driving power.

27 Claims, 13 Drawing Sheets

(58) Field of Classification Search
USPC .......................................................... 399/106
See application file for complete search history.

(56) References Cited

U.S. PATENT DOCUMENTS

| | | | |
|---|---|---|---|
| 2010/0158574 A1 | 6/2010 | Han | |
| 2013/0136489 A1 | 5/2013 | Yamaguchi et al. | |
| 2013/0164040 A1 | 6/2013 | Matsushita et al. | |
| 2013/0209137 A1 | 8/2013 | Hayashi et al. | |
| 2013/0308971 A1 | 11/2013 | Kashiide et al. | |
| 2013/0308972 A1* | 11/2013 | Shindo | G03G 15/0882 399/106 |
| 2014/0064784 A1 | 3/2014 | Hayashi et al. | |
| 2014/0072327 A1 | 3/2014 | Hayashi et al. | |
| 2014/0072330 A1 | 3/2014 | Yoshida et al. | |
| 2014/0079432 A1* | 3/2014 | Matsuzaki | G03G 15/0874 399/106 |
| 2014/0086620 A1 | 3/2014 | Takeuchi et al. | |
| 2014/0086621 A1 | 3/2014 | Makiguchi et al. | |
| 2014/0093272 A1 | 4/2014 | Matsumaru et al. | |
| 2014/0212166 A1* | 7/2014 | Takeuchi | G03G 15/0898 399/106 |
| 2014/0212181 A1 | 7/2014 | Nakamura et al. | |
| 2015/0220020 A1 | 8/2015 | Hayashi et al. | |
| 2015/0355576 A1 | 12/2015 | Yamasaki et al. | |

FOREIGN PATENT DOCUMENTS

| | | |
|---|---|---|
| JP | 2013037347 A | 2/2013 |
| JP | 2013-137522 A | 7/2013 |
| JP | 2014056045 A | 3/2014 |
| JP | 2014-071126 A | 4/2014 |
| JP | 2014-119504 A | 6/2014 |
| JP | 2014-142541 A | 8/2014 |

OTHER PUBLICATIONS

May 22, 2018 Office Action in Japanese Patent Application No. 2014-176129.

* cited by examiner

POWER SOURCE
POWER SOURCE
POWER SOURCE
POWER SOURCE
20
21
22
23
24
25a
25d
28
29
32
42
43
44
45
100
101
102
S
T
K
T1
T2
α

DEVELOPER CONTAINER, DEVELOPER STORAGE UNIT, PROCESS CARTRIDGE, AND IMAGE FORMING APPARATUS

BACKGROUND OF THE INVENTION

Field of the Invention

The present invention relates to a developer container, a developer storage unit, a process cartridge, and an image forming apparatus that uses these components.

Description of the Related Art

Japanese Patent Application Publication No. H5-197288 describes a developer storage unit including a developing chamber having a developing roller, and a developer container provided adjacent to the developing chamber in order to supply developer to the developing chamber. The developing chamber and the developer storage container communicate with each other via an opening, and the opening is sealed by a sealing member. The sealing member is attached to an end portion of an unsealing member that is supported rotatably inside the developer storage container, and when the unsealing member rotates, the sealing member is peeled away. When the sealing member is peeled away, the opening is opened so that the developer can move through the opening. The unsealing member rotates in conjunction with an operation of a process cartridge. According to this configuration, the sealing member can be peeled away in conjunction with the operation of the process cartridge so that a user does not have to remove the sealing member him/herself (Japanese Patent Application Publication No. H5-197288, FIG. 1).

Further, Japanese Patent Application Publication No. 2013-037347 discloses a developer storage unit including a developer bag, a sealing member, an unsealing member, developer supply roller, and a developing roller. The developer bag is a flexible container capable of storing developer, and includes an opening through which the developer can be discharged. The sealing member is adhered to the developer bag so as to seal the opening in the developer bag, and when the unsealing member, which is supported rotatably inside the developer storage unit, rotates, the sealing member is wound up so as to be peeled away from the developer bag.

The developer stored in the developer bag is discharged through the opening when the opening is opened, and supplied to the developing roller via the developer supply roller. By inserting the developer bag filled with the developer into the developer storage unit and opening the developer bag within the developer storage unit, the developer can be prevented from scattering when the developer is charged into the developer storage unit (Japanese Patent Application Publication No. 2013-037347, FIG. 1).

SUMMARY OF THE INVENTION

In Japanese Patent Application Publication No. H5-197288, however, when the developer is charged into the developer storage container after adhering the sealing member to the opening of the developer storage container, the unsealing member may rotate due to a charging pressure of the charged developer. Further, the unsealing member may rotate due to vibration generated in a conveyance process executed during manufacture of the process cartridge or during transportation of the process cartridge, and as a result, the sealing member may be opened by mistake.

In Japanese Patent Application Publication No. 2013-037347, the developer bag filled with the developer is inserted into the developer storage unit, whereupon the developer bag is opened within the developer storage unit, and therefore the unsealing member can be prevented from rotating due to the charging pressure of the developer. However, likewise in Japanese Patent Application Publication No. 2013-037347, the sealing member may be opened by mistake due to vibration.

An object of the present invention is therefore to provide a technique for solving the problem described above by preventing a sealing member from being opened by mistake due to unintended rotation of an unsealing member.

A developer container comprising:

a developer storage chamber that stores developer and includes an opening;

a sealing member that seals the opening;

an unsealing member that opens the opening by rotating such that the sealing member, a part of which is attached to the unsealing member, is peeled away;

a stirring member that is attached to the unsealing member; and a regulating portion that regulates rotation of the unsealing member by contacting the stirring member, wherein the regulating portion is provided to regulate the rotation of the unsealing member when the developer container receives an external force, and allow the unsealing member to rotate such that the opening is opened when the unsealing member receives driving power.

A developer storage unit comprising:

a flexible container that includes an opening and stores developer;

a frame within which the flexible container is stored;

a sealing member that seals the opening;

an unsealing member that is disposed within the frame on an outer side of the flexible container so as to rotate upon reception of driving power from a driving power source, and opens the opening by rotating such that the sealing member, a part of which is attached to the unsealing member, is peeled away;

a stirring member that is attached to the unsealing member; and a regulating portion that allows the unsealing member to rotate when the unsealing member receives the driving power, and regulates rotation of the unsealing member by contacting the stirring member when the unsealing member does not receive the driving power.

A developing apparatus comprising:

the developer container;

a developer bearing member that bears developer; and a developing chamber in which the developer bearing member is provided, the developing chamber communicating with the developer storage chamber via the opening.

A developing apparatus comprising:

the developer storage unit;

a developer bearing member that bears developer; and a developing chamber in which the developer bearing member is provided, the developing chamber communicating with a developer storage portion in the frame.

A developing apparatus comprising:

the developer container;

a developer bearing member that bears developer; and a developing chamber in which the developer bearing member is provided, the developing chamber communicating with the developer storage chamber via the opening.

A developing apparatus comprising:

the developer storage unit;

a developer bearing member that bears developer; and a developing chamber in which the developer bearing member is provided, the developing chamber communicating with a developer storage portion in the frame.

A process cartridge comprising:

the developer container; and an image bearing member that bears a developer image formed from the developer.

A process cartridge comprising:

the developer storage unit; and an image bearing member that bears a developer image formed from the developer.

An image forming apparatus comprising the developer container according to claim 1, wherein the image forming apparatus forms an image on a recording medium using the developer.

An image forming apparatus comprising the developer storage unit according to claim 12, wherein the image forming apparatus forms an image on a recording medium using the developer.

Further features of the present invention will become apparent from the following description of exemplary embodiments with reference to the attached drawings.

DESCRIPTION OF THE EMBODIMENTS

Exemplary embodiments of the present invention will be described in detail below with reference to the drawings. Note, however, that dimensions, materials, shapes, relative positions, and so on of constituent components described in the embodiments may be modified appropriately in accordance with a configuration of an apparatus to which the invention is applied and various conditions, and unless specified otherwise, the scope of the invention is not limited thereto.

First Embodiment

An overall configuration and an image forming process of an image forming apparatus will be described below using FIGS. 2 and 3.

Figure 2:
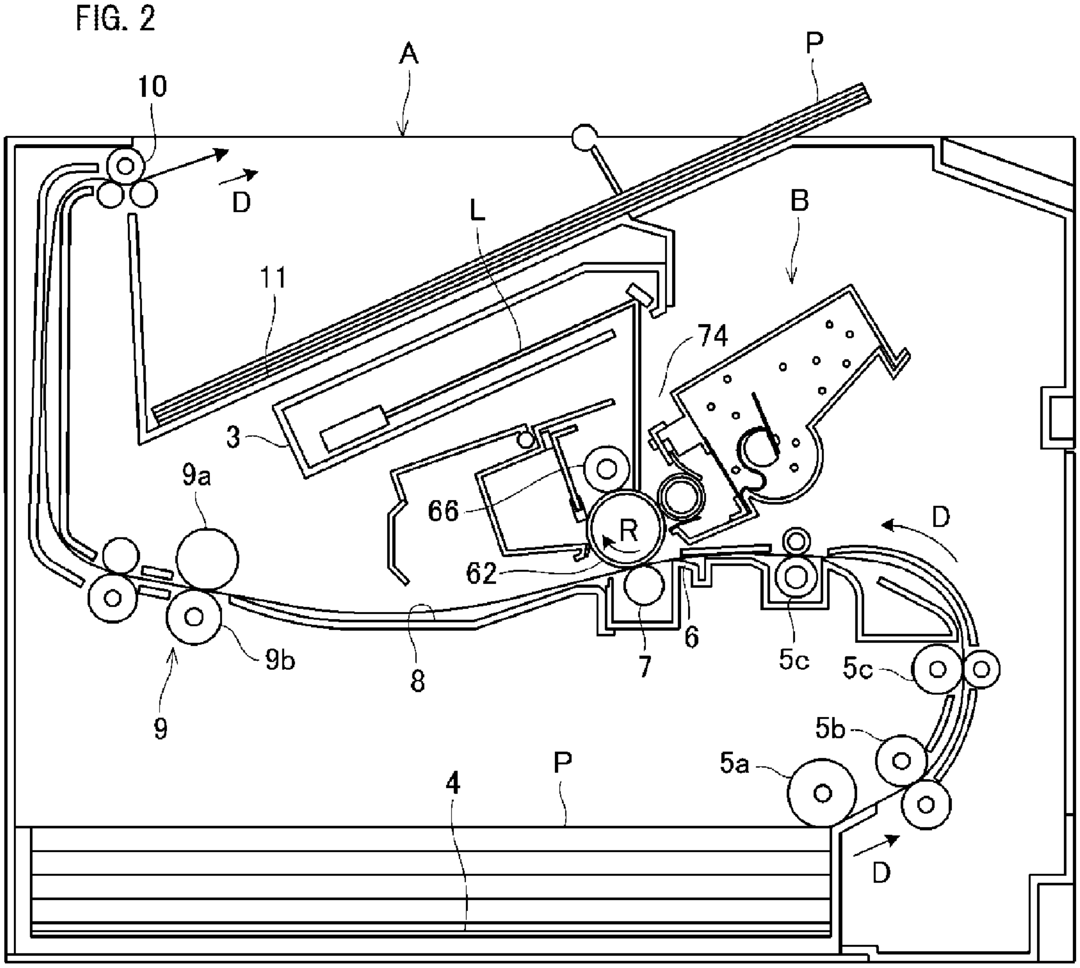
FIG. 2 is a sectional view showing a configuration of an image forming apparatus.

FIG. 2 is a sectional view showing an image forming apparatus main body (referred to hereafter as an apparatus main body A) and a process cartridge (referred to hereafter as a cartridge B) according to a first embodiment of the present invention. Here, the image forming apparatus is an apparatus that forms an image on a recording medium using an electrophotographic image forming method. Examples of image forming apparatuses include an electrophotographic copier, an electrophotographic printer (an LED printer, a laser beam printer, or the like), a facsimile apparatus, a word processor, and so on, for example. Further, the process cartridge is a cartridge in which an electrophotographic photosensitive drum and developing means for turning an electrostatic latent image formed on the electrophotographic photosensitive drum into a visible image using developer are formed integrally, and is attached detachably to the image forming apparatus main body.

Figure 3:
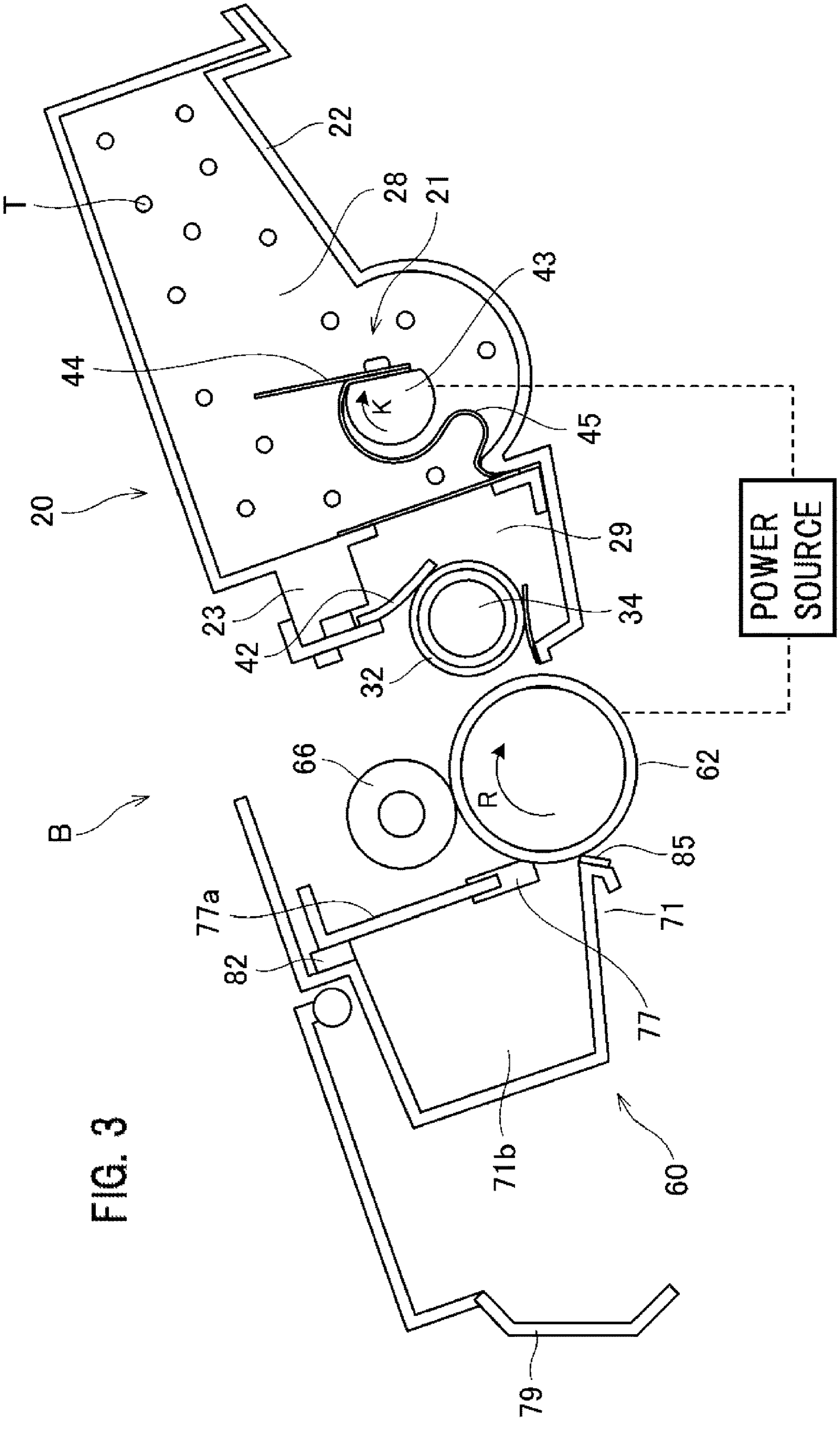
FIG. 3 is a sectional view showing a configuration of a process cartridge.

FIG. 3 is a sectional view of the cartridge B. Here, the apparatus main body A of the image forming apparatus denotes a part of the image forming apparatus excluding the cartridge B.

(Overall Configuration of Image Forming Apparatus)

In FIG. 2, the image forming apparatus is a laser beam printer employing an electrophotographic technique, in which the cartridge B can be attached to and detached from the apparatus main body A. When the cartridge B is attached to the apparatus main body A, an exposure apparatus 3 (a laser scanner unit) is disposed on an upper side of an electrophotographic photosensitive drum 62 (corresponding to an image bearing member) of the cartridge B. Here, the upper side and a lower side denote a vertical direct ion when the image forming apparatus is used normally.

Further, a sheet tray 4 housing a recording medium (referred to hereafter as a sheet material P) on which images are formed is disposed on the lower side of the cartridge B.

Furthermore, a pickup roller 5*a*, a pair of feeding rollers 5*b*, a pair of conveyance rollers 5*c*, a transfer guide 6, a transfer roller 7, a conveyance guide 8, a fixing apparatus 9, a pair of discharge rollers 10, a discharge tray 11, and so on are disposed in the apparatus main body A in sequence in a conveyance direction D of the sheet material P. Note that the fixing apparatus 9 is constituted by a heat roller 9*a* and a pressure roller 9*b*.

(Image Forming Process)

Next, an outline of an image forming process will be described using FIGS. 2 and 3. The electrophotographic photosensitive drum (referred to hereafter as the drum 62) is driven to rotate in a direction of an arrow R at a predetermined circumferential velocity (process speed) on the basis of a print start signal. Here, the direction of the arrow R corresponds to a rotation direction of the drum 62 when the sheet material P housed in the sheet tray 4 is conveyed to the discharge tray 11.

A charging roller 66 to which a bias voltage is applied contacts an outer peripheral surface of the drum 62 so that the outer peripheral surface of the drum 62 is evenly charged. The exposure apparatus 3 outputs a laser beam L corresponding to image information. The laser beam L passes through an exposure window portion 74 above the drum 62 so as to scan and expose the outer peripheral surface of the drum 62. As a result, an electrostatic latent image corresponding to the image information is formed on the outer peripheral surface of the drum 62.

Meanwhile, as shown in FIG. 3, a developing unit 20 includes a developing chamber 29 and a developer storage chamber (referred to hereafter as a toner storage chamber 28). A developer T (referred to hereafter as a toner T) stored in the toner storage chamber 28 is conveyed to the developing chamber 29 by a stirring member 44 provided in an unsealing member 43 when the unsealing member 43 rotates. The stirring member 44 is attached to the unsealing member so that when the unsealing member 43 rotates, the unsealing member 43 and the stirring member 44 rotate integrally.

The toner T is carried on a surface of a developing roller 32 (corresponding to a developer bearing member) by a magnetic force of a magnet roller 34 (a fixed magnet). The magnet roller 34 is positioned inside the developing roller 32. The toner T is triboelectrically charged by a developing blade 42 such that a layer thickness of the toner T on a peripheral surface of the developing roller 32 is regulated. The developing blade 42 is pressed against the outer peripheral surface of the developing roller 32.

The toner T is transferred to the drum 62 in accordance with the electrostatic latent image, whereby the electrostatic latent image is turned into a visible toner image (corresponding to a developer image). Further, as shown in FIG. 2, the sheet material P housed in a lower portion of the apparatus main body A is fed from the sheet tray 4 toward a transfer position by the pickup roller 5*a*, the pair of feeding rollers 5*b*, and the pair of conveyance rollers 5*c* in accordance with an output timing of the laser beam L. Here, the transfer position denotes a position between the drum 62 and the transfer roller 7.

The fed sheet material P is supplied to the transfer position via the transfer guide 6. In the transfer position, the toner image is gradually transferred onto the sheet material P from the drum 62. After the toner image has been transferred onto the sheet material P, the sheet material P is conveyed along the conveyance guide 8 from the transfer position to the fixing apparatus 9. The sheet material P then passes through a nip portion between the heat roller 9*a* and the pressure roller 9*b* constituting the fixing apparatus 9.

In the nip portion, heat/pressure fixing processing is performed, whereby the toner image is fixed on the sheet material P. The sheet material P, after undergoing the processing for fixing the toner image thereon, is conveyed to the pair of discharge rollers 10 and discharged by the pair of discharge rollers 10 onto the discharge tray 11.

Meanwhile, as shown in FIG. 3, toner remaining on the outer peripheral surface of the drum 62 following transfer is removed by a cleaning blade 77 so that the drum 62 can be used again in the next image forming process. The cleaning blade 77 removes the toner adhered to the drum 62 by pressing the outer peripheral surface of the drum 62. The toner removed from the drum 62 is stored in a waste toner chamber 71*b* provided in a cleaning unit 60.

(Attachment/Detachment of Cartridge)

Figure 4:
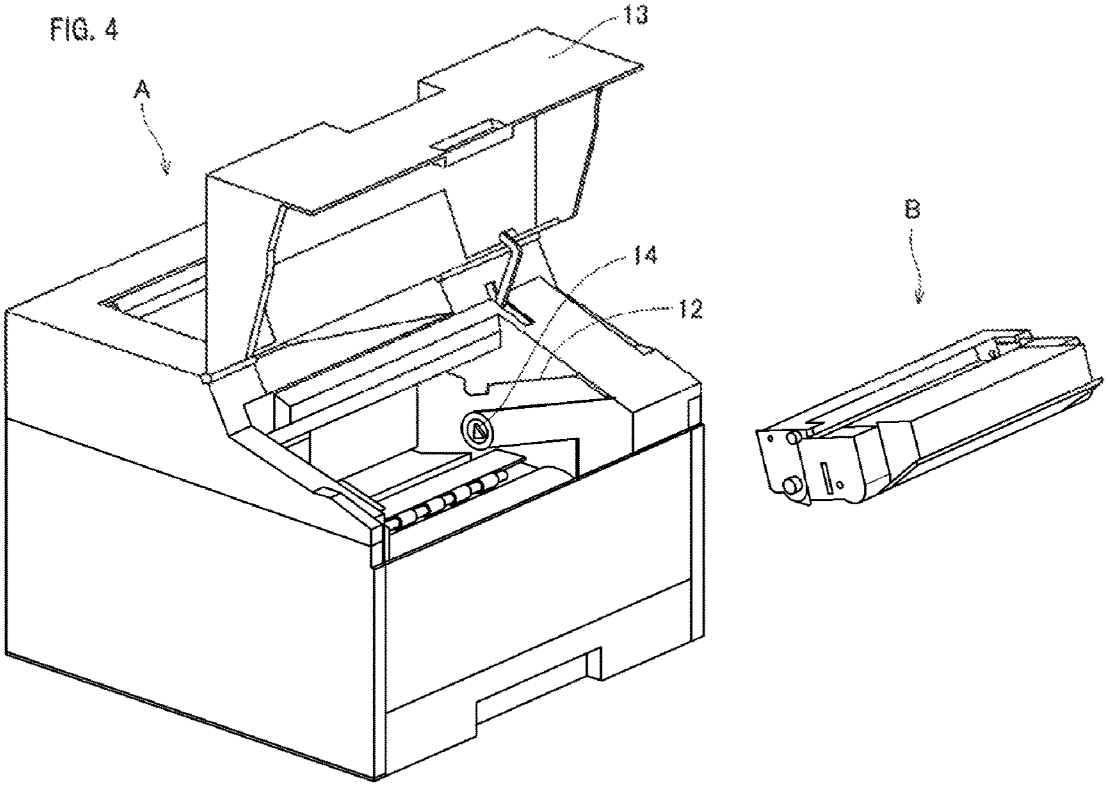
FIG. 4 is a perspective view showing a condition in which the process cartridge is attached to the image forming apparatus.

Next, attachment and detachment of the cartridge B to and from the apparatus main body A will be described using FIG. 4. FIG. 4 is a perspective view showing the apparatus main body A and the cartridge B in a condition where an opening/closing door 13 of the apparatus main body A is opened in order to attach or detach the cartridge B.

The opening/closing door 13 is attached to the apparatus main body A rotatably. The cartridge B is attached to the apparatus main body A along a guide rail 12 when the opening/closing door 13 is open. A drive shaft 14 of the apparatus main body A, which is driven by a motor (not shown), engages with a driving force reception portion 63*a* (FIG. 6) provided on the cartridge B.

As a result, the drum 62, which is joined to the driving force reception portion 63*a*, receives driving force from a driving power source (i.e. the motor) attached to the apparatus main body A, whereby the drum 62 rotates. Furthermore, driving power is fed to the charging roller 66 and the developing roller 32 (FIG. 3) from a driving power feeding unit (not shown) of the apparatus main body A.

(overall Configuration of Cartridge)

Next, an overall configuration of the cartridge B will be described using FIGS. 3 and 5.

Figure 5:
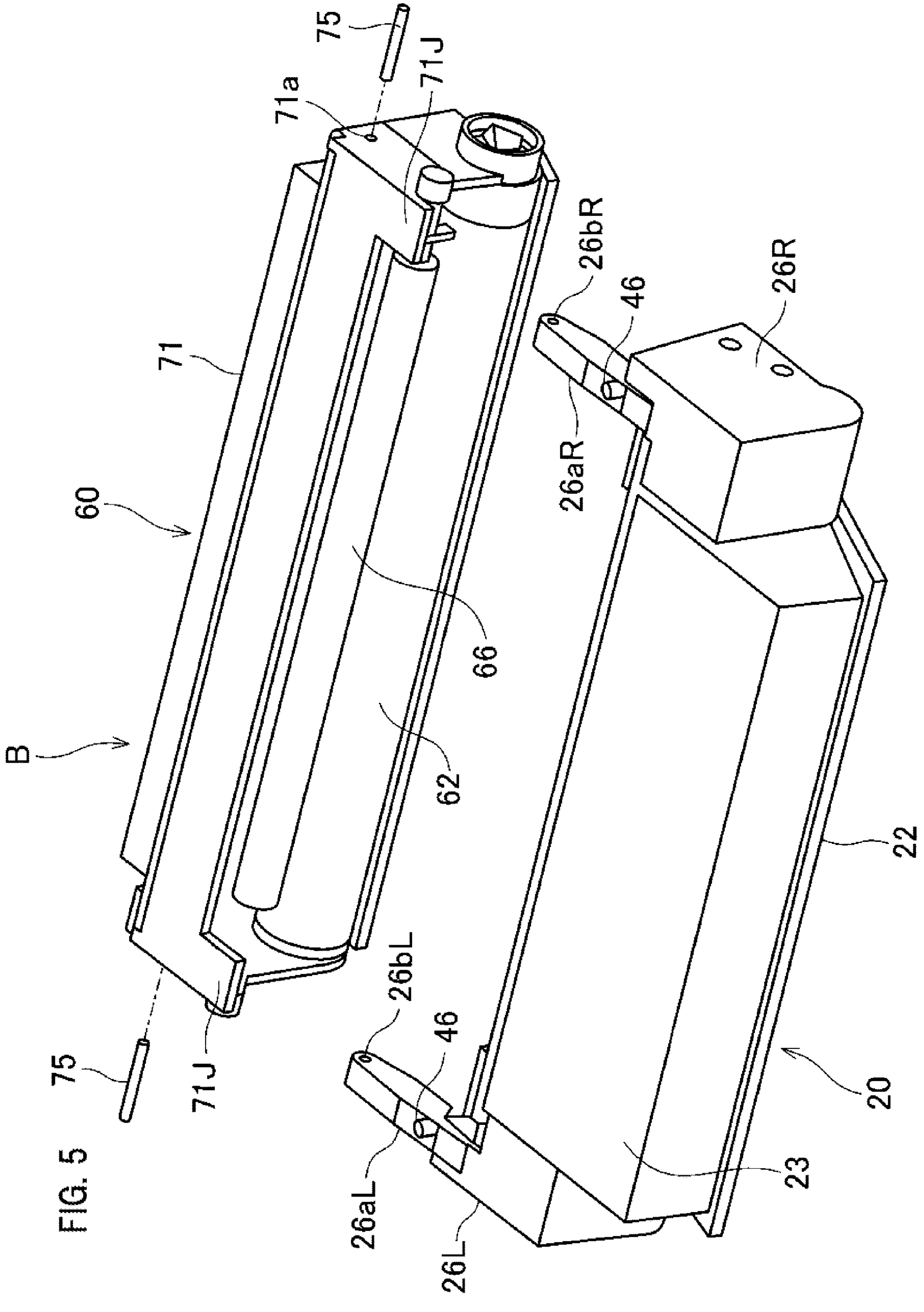
FIG. 5 is an exploded perspective view of the process cartridge.

FIG. 5 is a perspective view illustrating a configuration of the cartridge B. The cartridge B is constituted by the cleaning unit 60 and the developing unit 20. The cleaning unit 60 includes a cleaning frame 71, the drum 62, the charging roller 66, and the cleaning blade (FIG. 3).

The developing unit 20, meanwhile, includes a bottom member 22, a developer container 23, a first side member 26L, a second side member 26R, the developing blade 42 (FIG. 3), the developing roller 32 (FIG. 3), and the magnet roller 34 (FIG. 3). The developing unit 20 also includes the unsealing member 43 (FIG. 3), the toner T (FIG. 3), and biasing members 46 (FIG. 4).

The cleaning unit 60 and the developing unit 20 are joined to each other by joining members 75 to be capable of rotating, thereby forming the cartridge B. Rotation holes 26*b*L, 26*b*R are provided parallel to the developing roller 32 on respective tip ends of arm portions 26*a*L, 26*a*R formed respectively on the first side member 26L and the second side member 26R, which constitute respective lengthwise direction end portions of the developing unit 20. Here, the lengthwise direction corresponds to a rotary axis direction of the developing roller serving as the developing means and the electrophotographic photosensitive drum.

Further, insertion holes 71*a* for inserting the joining members 75 are formed in respective lengthwise direction end portion of the cleaning frame 71. The arm portions 26*a*L, 26*a*R are aligned with predetermined positions of the cleaning frame 71, whereupon the joining members 75 are passed through the rotation holes 26*b*L, 26*b*R and the insertion holes 71*a*. As a result, the cleaning unit 60 and the developing unit 20 are joined to be capable of rotating using the joining members 75 as a rotary shaft.

At this time, the biasing members 46, which are attached to respective bases of the arm portions 26*a*L, 26*a*R, impinge on respective cleaning frame end portions 71J such that the developing unit 20 is biased toward the cleaning unit 60 using the joining members 75 as a rotary shaft.

As a result, the developing roller 32 (FIG. 3) is pressed firmly in the direction of the drum 62. Further, the developing roller 32 is maintained at a predetermined interval relative to the drum 62 by interval maintaining members 38 (FIG. 7) attached to respective end portions of the developing roller 32.

(Configuration of Cleaning Unit)

Next, a configuration of the cleaning unit 60 will be described using FIG. 6.

Figure 6:
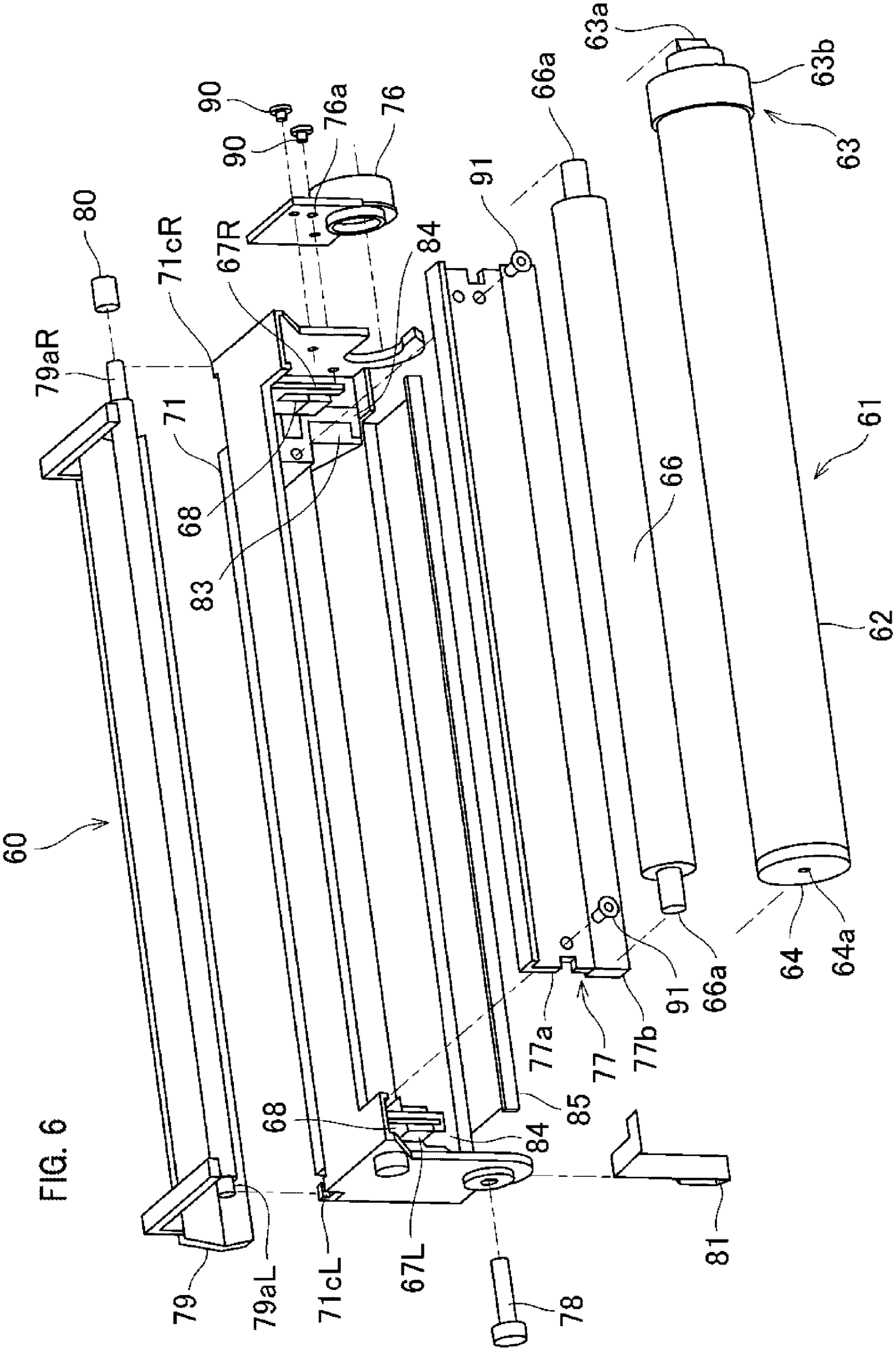
FIG. 6 is an exploded perspective view of a cleaning unit.

FIG. 6 is a perspective view illustrating the configuration of the cleaning unit 60.

The cleaning blade 77 is constituted by a support member 77*a* formed from a metal plate, and an elastic member 77*b* formed from an elastic material such as urethane rubber. Respective ends of the support member 77*a* are fixed to the cleaning frame 71 by screws 91. The elastic member 77*b* contacts the drum 62 in order to remove toner remaining on the outer peripheral surface of the drum 62.

The removed toner is stored in the waste toner chamber 71*b* (FIG. 3) of the cleaning unit 60. Further, a first sealing member 82 (FIG. 3), a second sealing member 83, a third sealing member 84, and a fourth sealing member 85 are fixed to predetermined positions of the cleaning frame 71 by double-sided tape or the like. The first sealing member 82 is provided to extend in the lengthwise direction in order to prevent waste toner from leaking out between the support member 77*a* (FIG. 3) of the cleaning blade 77 and the cleaning frame 71 (FIG. 3).

The second sealing member 83 prevents waste toner from leaking out from respective lengthwise direction ends of the elastic member 77*b* of the cleaning blade 77. The third sealing member 84 prevents waste toner from leaking out from the respective lengthwise direction ends of the elastic member 77*b* of the cleaning blade 77 while wiping away toner and the like adhered to the drum 62. The fourth sealing member 85 (FIGS. 3 and 6) is provided on the cleaning frame 71 in contact with the drum 62 so as to extend in the lengthwise direction, and prevents waste toner from leaking out to an upstream side of the cleaning blade 77 in a rotation direction of the drum 62.

An electrode plate 81, biasing members 68, and charging roller bearings 67L, 67R are attached to the cleaning frame 71. A shaft portion 66*a* of the charging roller 66 is fitted into the charging roller bearings 67L, 67R. The charging roller 66 is biased against the drum 62 by the biasing members 68, and supported to be capable of rotating by the charging roller bearings 67L, 67R. The charging roller 66 thus rotates in response to rotation of the drum 62.

Note that the electrode plate 81, the biasing members 68, and the charging roller bearing 67L, and the shaft portion 66*a* are conductive. The electrode plate 81 contacts the driving power feeding unit (not shown) of the apparatus main body A. Power is thus fed to the charging roller 66 using these components as a driving power feeding path. The drum 62 is joined integrally to a flange 63 and a flange 64 to form an electrophotographic photosensitive drum unit (referred to hereafter as a drum unit 61). Caulking, adhesion, welding, and so on may be used as a joining method.

An earth contact or the like (not shown) is joined to the flange 64. Further, the flange 63 includes a driving force reception portion 63*a* that receives driving force from the driving power source attached to the apparatus main body A, and a flange gear portion 63*b* that transmits the driving force to the developing roller 32. A bearing member 76 is fixed integrally to a driven side of the cleaning frame 71 by a screw 90, and a drum shaft 78 is fixed by indentation to a non-driven side of the cleaning frame 71. Here, the bearing member 76 is fixed by the screw 90, but a method such as welding, for example, may be used instead. Note that in the lengthwise direction, a side on which the electrophotographic photosensitive drum receives driving force from the image forming apparatus main body is set as the driven side (the side of the driving force reception portion 63*a* in FIG. 6), and an opposite side thereto is set as the non-driven side.

The bearing member 76 is fitted to the flange 63, and the drum shaft 78 is fitted into a hole 64*a* formed in the flange 64. As a result, the drum unit 61 is supported rotatably on the cleaning frame 71. A protective member 79 is supported rotatably on the cleaning frame 71 in order to protect (shield) and expose the drum 62.

A biasing member 80 is attached to a driven side shaft portion 79*a*R of the protective member 79 in order to bias the protective member 79 in an orientation for protecting the drum 62. A non-driven side shaft portion 79*a*L and the driven side shaft portion 79*a*R of the protective member 79 are fitted to bearing members 71*c*L, 71*c*R of the cleaning frame 71.

(Developing Unit)

Figure 7:
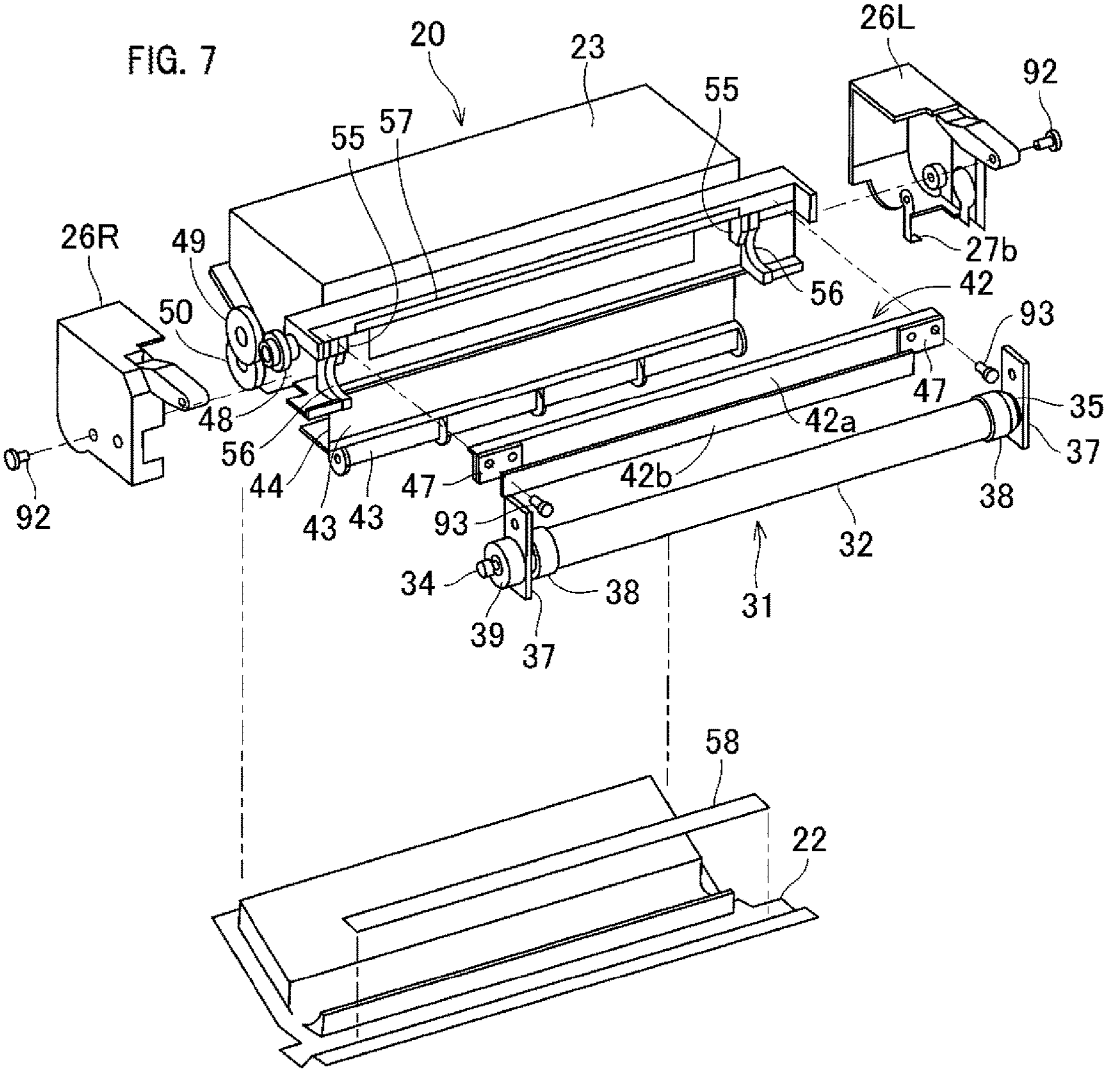
FIG. 7 is an exploded perspective view of the developing unit.

Next, a configuration of the developing unit 20 will be described using FIGS. 3 and 7. FIG. 7 is a perspective view illustrating the configuration of the developing unit 20. As shown in FIG. 7, a developer storage container constituted by the bottom member 22 and the developer container 23 forms the toner storage chamber 28 storing the toner T and the developing chamber 29, as shown in FIG. 3.

The bottom member 22 and the developer container 23 are joined integrally by means such as welding. The unsealing member 43 is supported by the developer container 23 on the non-driven side, and supported by an opening gear 50 attached to the developer container 23 on the driven side. The unsealing member 43 is thus configured to rotate within the toner storage chamber 28 in a direction of an arrow K (FIG. 1) in accordance with the opening gear 50.

Further, as shown in FIG. 3, one end of the sealing member 45 is attached to the developer container 23, and another end thereof is attached so as to be sandwiched between the bottom member 22 and the developer container 23. The sealing member 45 thus partitions the toner storage chamber 28 from the developing chamber 29. As a result, the toner T is prevented from leaking out of the toner storage chamber 28 during transportation of the cartridge B. The sealing member 45 may be attached to the developer container 23 by a fixing method such as thermal welding, for example. Alternatively, the sealing member 45 may be fixed by laser welding, double-sided tape, and so on.

A configuration of an unsealing member unit 21 constituted by the unsealing member 43, the sealing member 45, and the stirring member 44, and a method of opening the sealing member 45 in order to supply the toner T to the developing chamber 29, will be described in detail below. As shown in FIG. 7, a first sealing member 55, a second sealing member 56, and a third sealing member 57 are provided in predetermined positions of the developer container 23.

A fourth sealing member 58 is provided in a predetermined position of the bottom member 22 after the bottom member 22 is joined to the developer container 23. The first sealing member 55 prevents the toner T from leaking out from respective lengthwise ends of an elastic member 42*b* of the developing blade 42. The developing blade 42 is constituted by a support member 42*a* formed from a metal plate, and the elastic member 42*b*, which is formed from an elastic material such as urethane rubber. The developing blade 42 is fixed to the developer container 23 together with a cleaning member 47 by screws 93 at respective ends of the support member 42*a*.

The second sealing member 56 prevents the toner T from leaking out from respective lengthwise ends of the developing roller 32. The third sealing member 57 (FIG. 3) is provided to extend in the lengthwise direction, and prevents the toner T from leaking out between the support member 42*a* of the developing blade 42 and the developer container 23. The fourth sealing member 58 (FIG. 3) is provided to extend in the lengthwise direction in contact with the developing roller 32, and prevents the toner T from leaking out from a lower side of the developing roller 32.

The elastic member 42*b* (FIG. 3) contacts the developing roller 32 in order to define an amount of toner on the peripheral surface of the developing roller 32 and apply a triboelectric charge to the developing roller 32. The cleaning member 47 contacts the surface of the developing roller 32 at respective end portions in order to clean away toner and the like adhered thereto. The developing roller unit 31 includes the developing roller 32, the magnet roller 34, a flange 35, bearing members 37, the interval maintaining members 38, and a developing roller gear 39.

The magnet roller 34 is inserted from the non-driven side end portion of the developing roller 32, and the flange 35 is fixed by indentation to an end portion thereof. A conductive electrode member 27*a* (not shown) is incorporated into the flange 35, and the electrode member 27*a* contacts the developing roller 32 and an electrode member 27*b*. The conductive electrode member 27*b* is fixed to the first side member 26L.

The electrode member 27*b* contacts the driving power feeding unit (not shown) of the apparatus main body A so that driving power is fed from the electrode member 27*b* to the developing roller 32 using the electrode member 27*a* (not shown) as a driving power feeding path. The interval maintaining members 38 are attached to the respective end portions of the developing roller 32. The bearing members 37 are disposed on respective outer sides of the interval maintaining members 38, and on the driven side, the developing roller gear 39 is attached to an outer side of the bearing member 37.

The developing roller 32 is supported rotatably by the bearing members 37 disposed on either side. A first gear 48 and a second gear 49 serving as driving force transmitting members are attached rotatably to a developing frame. Hence, when the flange gear portion 63*b* (FIG. 6), the developing roller gear 39, the first gear 48, the second gear 49, and the opening gear 50 mesh with each other successively and rotate, driving force received from the drive source attached to the apparatus main body A is transmitted to the developing roller 32 and the unsealing member 43.

The first side member 26L and the second side member 26R are fixed to the developing frame at respective lengthwise direction ends using screws 92. At this time, the bearing members 37 of the developing roller unit 31 are held respectively by the first side member 26L and the second side member 26R.

(Unsealing Member Unit)

Figure 8A:
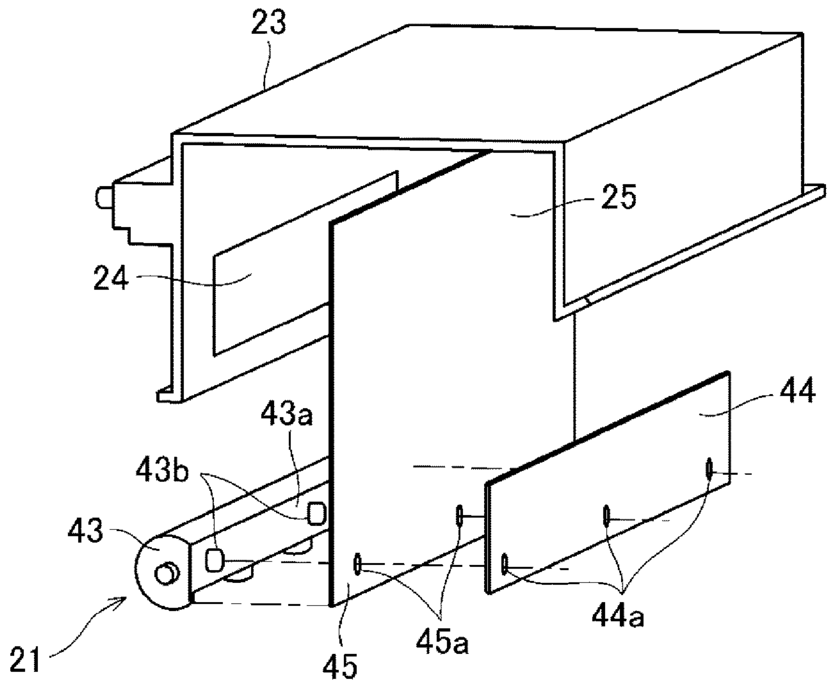
FIGS. 8A and 8B are perspective views showing a configuration of an unsealing member unit.
Figure 8B:
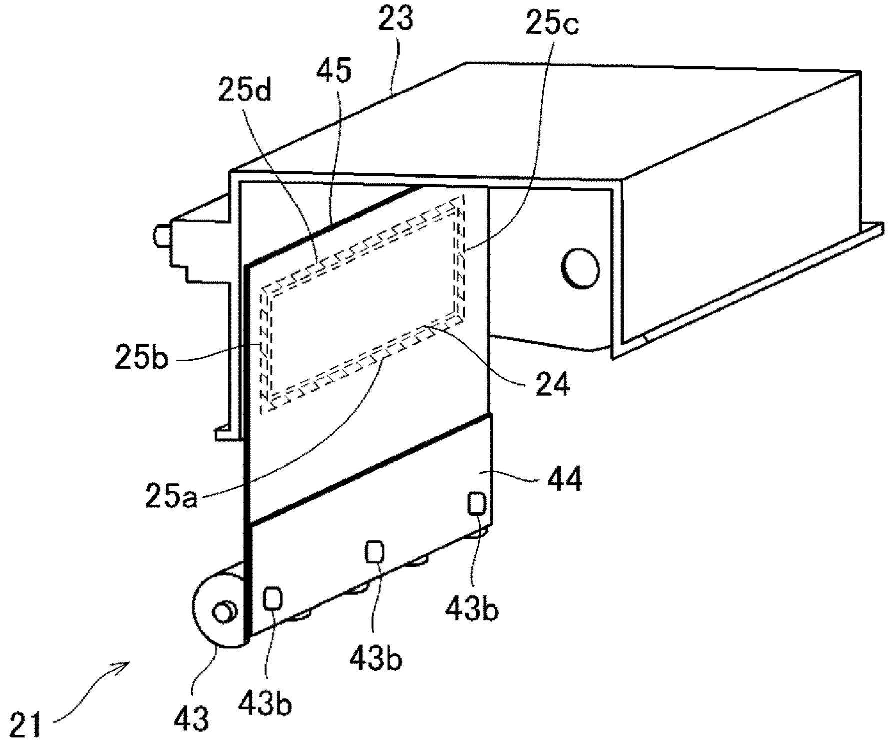

Next, a configuration of the unsealing member unit 21 will be described using FIGS. 8A and 8B. FIGS. 8A and 8B are perspective views illustrating the configuration of the unsealing member unit 21. As shown in FIG. 8A, the unsealing member unit 21 is constituted by the unsealing member 43, the sealing member 45, and the stirring member 44.

The unsealing member 43 is molded from a material such as PS or POM, and includes a shaft portion 43*a*, and at least one fixing projection 43*b* that projects in a perpendicular direction from the shaft portion 43*a*.

The stirring member 44 is molded from a flexible material such as PET, PC, or PPS, and includes a plurality of fixing holes 44*b* that correspond to the fixing projections 43*b*. A configuration of the stirring member 44 will be described in detail below.

The sealing member 45 is a bendable film-form sheet material having a thickness of approximately 10 to 100 μm, which is molded from a material that is compatible with the material of the developer container 23 or a material having an adhesive layer. A plurality of fixing holes 45*b* that correspond to the fixing projections 43*b* are likewise formed in the sealing member 45.

To assemble the unsealing member unit 21, the sealing member 45 and the stirring member 44 are fitted in that order to the fixing projections 43*b* of the unsealing member 43. Next, heat is applied to the fixing projections 43*b* in order to melt and caulk the fixing projections 43*b*, whereby the unsealing member 43, the stirring member 44, and the sealing member 45 are integrated. The present invention is not limited to this method of integrating the unsealing member unit 21, and welding, snap-fitting, or double-sided tape may be used instead.

Figure 1:
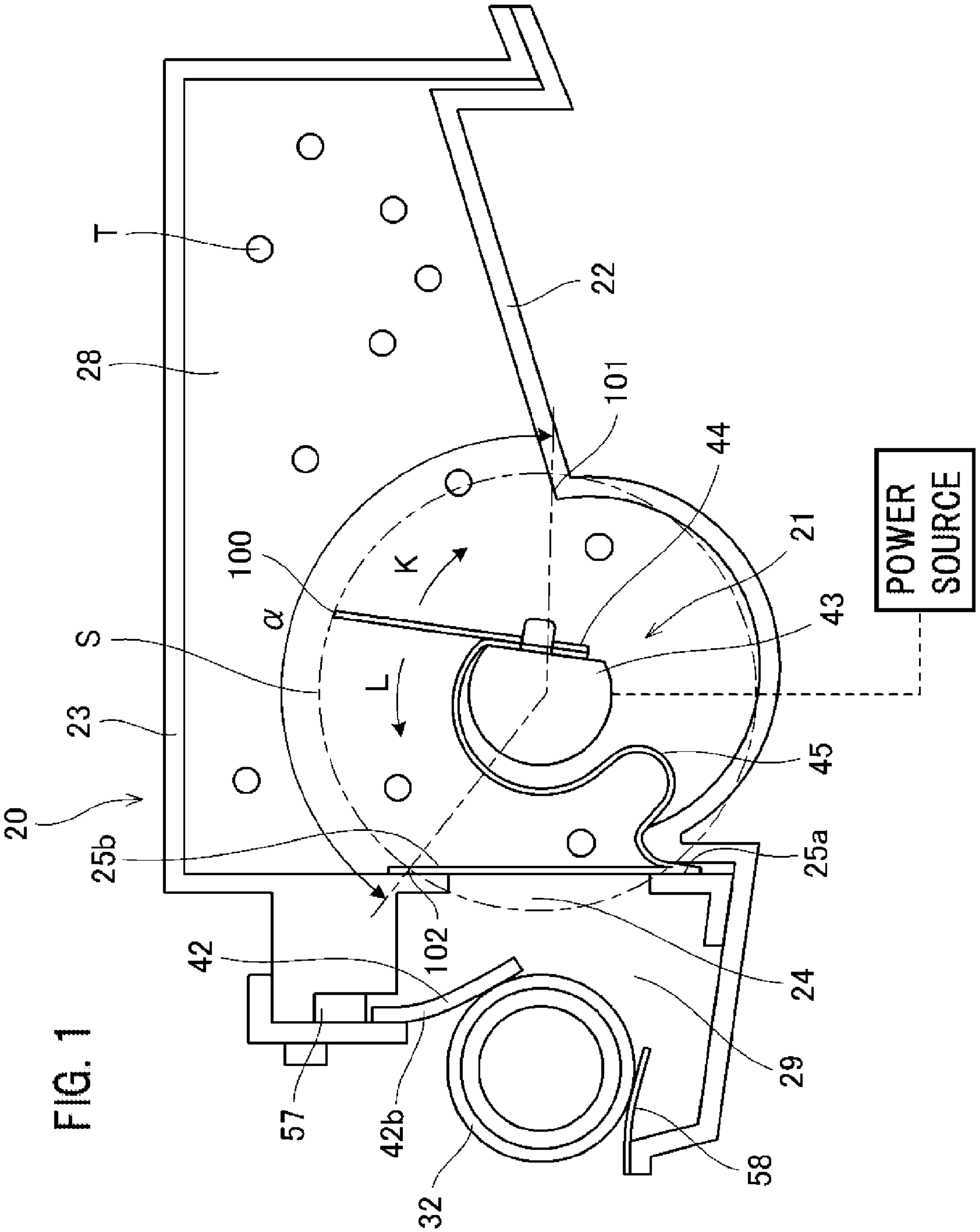
FIG. 1 is a sectional view showing a configuration of a developing unit according to a first embodiment of the present invention.

Next, a method of attaching the unsealing member unit 21 to the developer container 23 will be described. As described above, the developing chamber 29 and the toner storage chamber 28 are formed as shown in FIG. 1 by welding the developer container 23 to the bottom member 22. At this time, an opening 24 that connects the developing chamber 29 to the toner storage chamber 28 is formed in the developer container 23.

As shown in FIG. 8B, the sealing member 45 is adhered to the developer container 23 so as to surround a periphery of the opening 24 by performing thermal welding on an connecting portion 25 of the sealing member 45. Note that the four sides of the welded opening 24 are set respectively as connecting portions 25*a* to 25*d*. The adhesion method is not limited to thermal welding, and laser welding, double-sided tape, and so on may be used instead.

By sealing the opening 24, the toner T can be prevented from leaking out of the toner storage chamber 28 into the developing chamber 29 during transportation of the cartridge B. A length of the sealing member 45 must be set so that the connecting portions 25*a* to 25*d* for covering the opening 24 can be provided, and so that the sealing member 45 can be attached to the unsealing member 43.

(Opening Operation and Latching Operation of Unsealing Member Unit)

A manner in which rotation of the unsealing member unit 21 is regulated by a first latch portion (a first regulating portion) 101 and a second latch portion (a second regulating portion) 102, and a manner in which the unsealing member unit 21 is rotated by driving power from the driving power source, will be described below using FIG. 1, FIGS. 9A to 9D, FIGS. 10A to 10C, and FIGS. 11A and 11B.

FIG. 1 is a sectional view showing the developing unit 20 in a fully assembled condition. Note that in the first embodiment, the developing unit 20 corresponds to a developer container.

In the developing unit 20, the unsealing member unit 21 is disposed inside the toner storage chamber 28 (inside the developer storage chamber), and includes the unsealing member 43, the stirring member 44, and the sealing member 45. The unsealing member 43 is capable of rotating about a rotary axis that is parallel to a rotary axis of the developing roller 32, and rotates upon reception of driving power from the driving power source. The stirring member 44 is attached at one end to the unsealing member 43 such that when the unsealing member 43 rotates, the unsealing member 43 and stirring member 44 rotate integrally. Further, the stirring member 44 is flexible, and therefore deforms when a predetermined force is exerted thereon.

Furthermore, the sealing member 45 is attached to the unsealing member 43 such that when the unsealing member 43 rotates, the sealing member 45 starts to be wound up by the unsealing member 43. When the developing unit 20 is assembled, the opening 24 is sealed by the sealing member 45.

When the unsealing member 43 rotates, the stirring member 44 attached to the unsealing member 43 likewise rotates integrally therewith.

At this time, a locus drawn by a latch reception portion 100, which is constituted by a tip end part of the stirring member 44, in a case where the first latch portion 101 and the second latch portion 102 are not provided is set as a rotation locus S. Further, the first latch portion 101 and the second latch portion 102 are formed in the toner storage chamber 28 as, respectively, a part of an inner wall (a wall portion) of the bottom member 22 and a part of an inner wall (a wall portion) of the developer container 23. In the first embodiment, the first latch portion 101 and the second latch portion 102 are provided to overlap the rotation locus S, and therefore, when the unsealing member 43 rotates, the latch reception portion 100 contacts the first latch portion 101 or the second latch portion 102.

In the first embodiment, the latch reception portion 100 contacts the first latch portion 101 when the unsealing member 43 rotates in one direction, and contacts the second latch portion 102 when the unsealing member 43 rotates in another direction. Therefore, rotation of the unsealing member 43 in a K direction and an L direction can be regulated such that when no driving force is received from the driving power source, the stirring member 44 is capable of moving only within a range of an angle $\alpha$.

As described above, when the drum 62 (FIG. 6) rotates upon reception of driving force from the driving power source attached to the apparatus main body A, the driving force of the driving power source is transmitted to the unsealing member 43 via the opening gear 50 (FIG. 7). Here, a rotation direction of the opening gear 50 and the unsealing member 43 is determined according to a rotation direction of the drum 62. When the opening gear 50 is not fixed to the developer container 23, the developing unit 20 may be caused by an external force to vibrate, and as a result, the unsealing member 43 may rotate against the wishes of a user. A force other than the driving force of the driving power source, such as an external force exerted by an operator when assembling the cartridge B or an external force generated when the cartridge B collides with another package while being transported, for example, is envisaged as the external force.

FIGS. 9A, 9B, 9C, and 9D are views showing a condition in which the process cartridge is attached to the apparatus main body A, and the unsealing member 43 is rotated in a direction of an arrow K by driving force from the driving power source attached to the apparatus main body A. When the unsealing member 43 rotates upon reception of driving power from the driving power source, the sealing member 45 is peeled away from the developer container 23, and as a result, the opening 24 is opened.

Figures 9A, 9B, 9C, 9D:
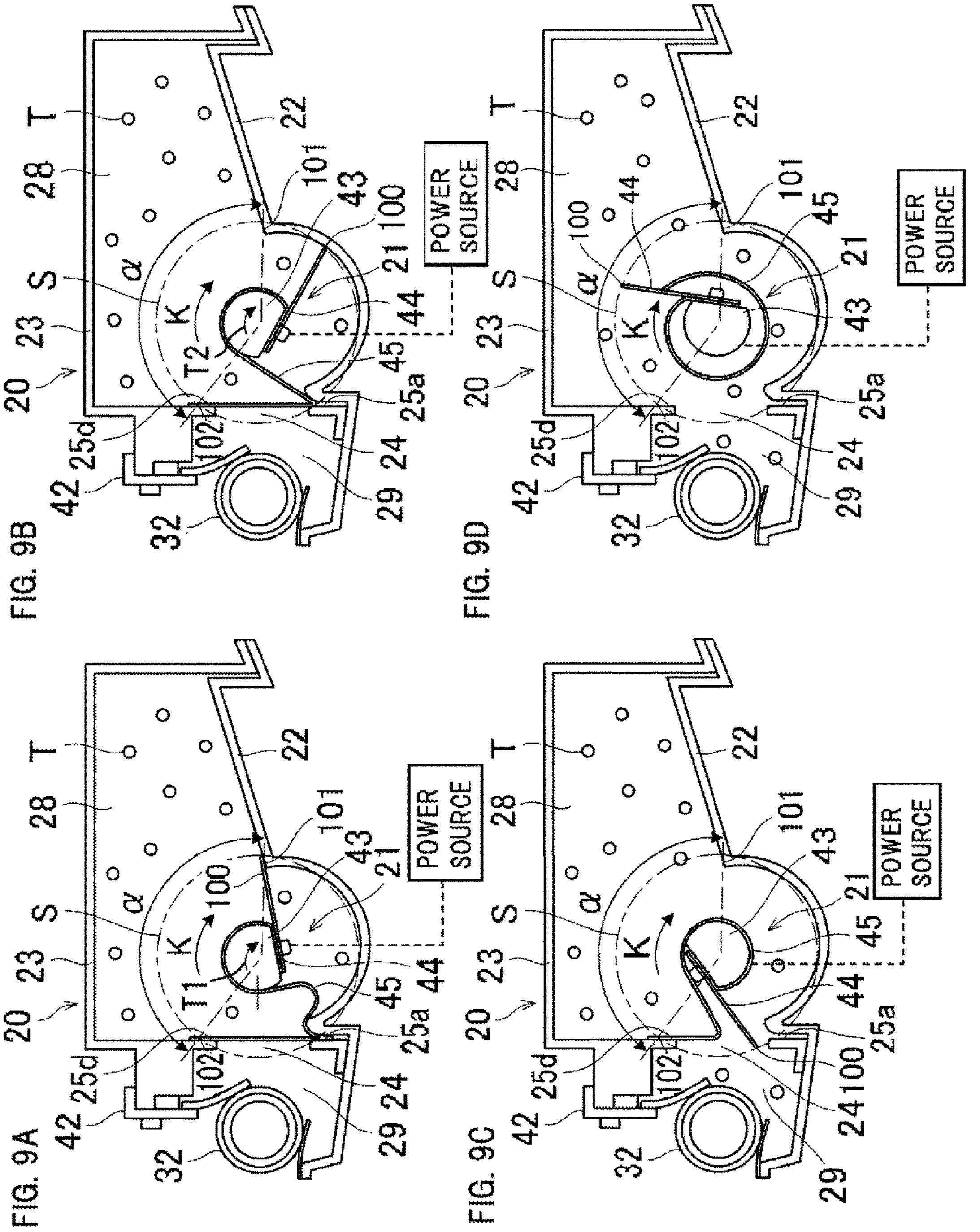
FIGS. 9A to 9D are sectional views showing an operation performed by a stirring member to open an opening.

When, as shown in FIG. 9A, the unsealing member 43 rotates in the direction of the arrow K, the sealing member 45 starts to be wound up around an outer periphery of the unsealing member 43. As described above, the first latch portion 101 is provided to overlap the rotation locus S, and therefore, when the unsealing member 43 rotates, the latch reception portion 100 contacts the first latch portion 101.

When the latch reception portion 100 contacts the first latch portion 101, torque is generated in the unsealing member 43. Here, torque generated when the latch reception portion 100 overruns the first latch portion 101 is set as overrun torque T1. In other words, when the unsealing member 43 rotates at a torque exceeding the overrun torque T1, the latch reception portion 100 overruns the first latch portion 101 even when the unsealing member 43 contacts the first latch portion 101, and as a result, the unsealing member 43 can continue to rotate. The overrun torque T1 differs according to an amount of overlap between the latch reception portion 100 and the first latch portion 101 (i.e. a size of a part by which the latch portion latches the latch reception portion), and here, the amount of overlap is set at approximately 5 mm to 10 mm.

When, as shown in FIG. 9B, the unsealing member 43 continues to rotate after overrunning the first latch portion 101, slack in the sealing member 45 gradually disappears. When, as shown in FIG. 9C, the unsealing member 43 rotates further, the sealing member 45 starts to peel away, starting from the connecting portion 25*a*. Thereafter, the connecting portions 25*b*, 25*c* serving as the respective lengthwise end portions of the sealing member 45, shown in FIG. 8B, gradually peel away, and finally, the connecting portion 25*d* peels away. When the sealing member 45 is fully wound up, as shown in FIG. 9D, the opening 24 is fully opened. When the opening 24 is opened, the toner T is stirred by the stirring member 44 every time the unsealing member unit 21 rotates, and as a result, the toner T is supplied from the toner storage chamber 28 to the developing chamber 29. Note that the stirring member 44 stirs the toner T by sliding against the bottom member 22.

According to the first embodiment, the first latch portion 101 and the second latch portion 102 are provided to allow the unsealing member 43 to rotate only when the unsealing member 43 is rotated by driving force from the driving power source attached to the apparatus main body A. As a result, the opening 24 can be opened by driving force from the driving power source while preventing the opening 24 from being opened against the wishes of the user.

Figure 10A:
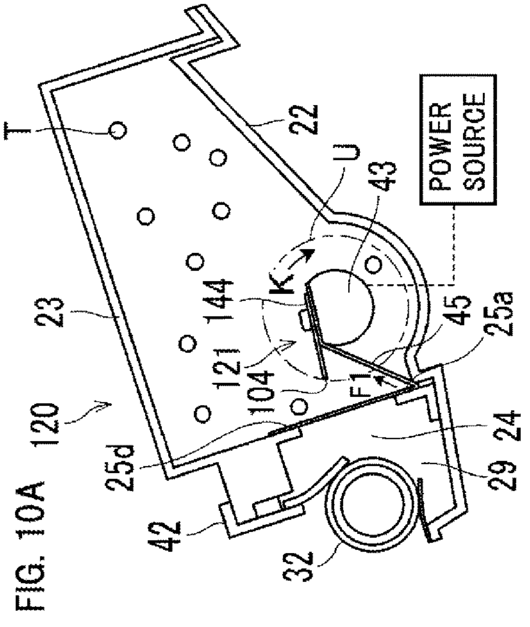
FIGS. 10A to 10C are sectional views showing an operation of a developing unit in which a latch portion is not formed.
Figure 10B:
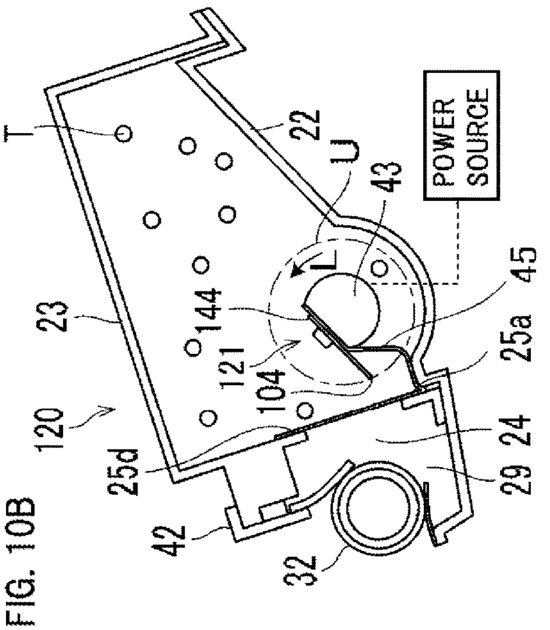
Figure 10C:
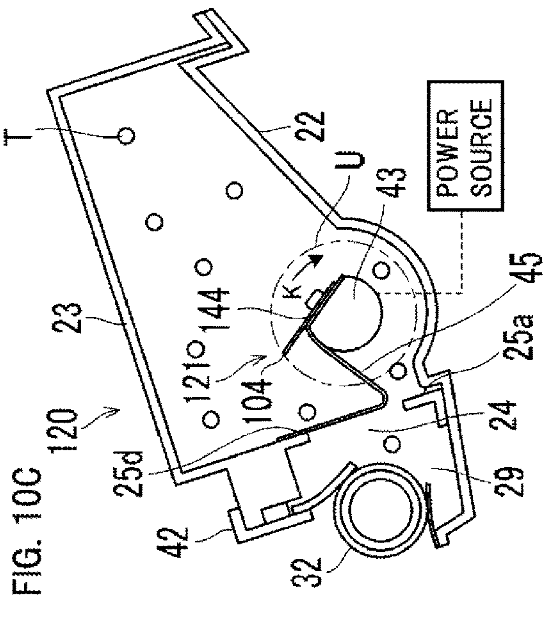

FIGS. 10A to 10C are views showing an opening operation of a developing unit configured such that the latch reception portion does not contact the latch portion. In FIGS. 10A to 10C, an unsealing member unit 121 includes the unsealing member 43, a stirring member 144, and the sealing member 45. The stirring member 144 is formed to be shorter than the stirring member 44 shown in FIGS. 9A to 9D. Accordingly, a rotation locus U of a latch reception portion 104 constituted by a tip end of the stirring member 144 does not overlap the first latch portion 101 and the second latch portion 102, and therefore the latch reception portion 104 does not contact the first latch portion 101 and the second latch portion 102.

Here, the unsealing member 43 may rotate repeatedly in the K direction and the L direction within the developing unit during a toner charging process, a transportation process executed when manufacturing the developing unit, during transportation of the process cartridge, and so on.

When the unsealing member 43 rotates in the K direction, as shown in FIG. 10A, a peeling force F1 is generated in the connecting portion 25*a*. When the unsealing member 43 rotates in the L direction, as shown in FIG. 10B, the sealing member 45 slackens again. When the unsealing member 43 rotates repeatedly in the K direction and the L direction, as shown in FIG. 10C, the sealing member 45 may peel away.

When rotation of the unsealing member 43 is unregulated, as in the developing unit 120, the opening 24 may open against the wishes of the user during the toner charging process or the like. According to the first embodiment, a situation in which the opening 24 is opened against the wishes of the user is prevented from occurring by regulating rotation of the unsealing member 43.

Further, in the case of the developing unit 120, the sealing member 45 must be fixed firmly to the developer container 23 to ensure that the sealing member 45 does not peel away.

When the sealing member 45 is fixed firmly to the developer container 23, increased torque must be generated in the unsealing member 43 in order to peel away the sealing member 45. For this purpose, the motor of the apparatus main body A, or an amount of driving power used to operate the motor, must be increased.

Furthermore, when the sealing member 45 is fixed firmly to the developer container 23, an amount of torque exerted on the unsealing member 43 while peeling away the sealing member 45 increases. When a large amount of torque is exerted on the unsealing member 43, the unsealing member 43 may deform, and therefore the unsealing member 43 must be increased in strength. In light of these adverse effects, the unsealing member 43 is preferably not structured to be capable of rotating freely.

Figure 11A:
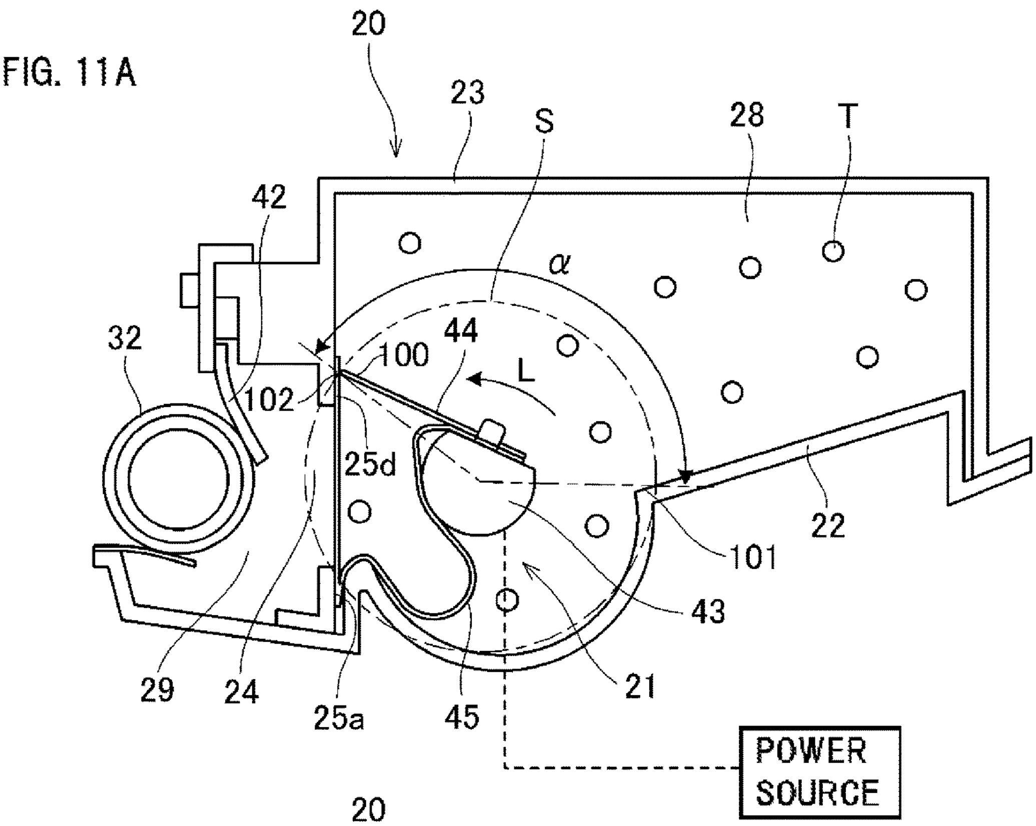
FIGS. 11A and 11B are sectional views showing an operation performed by the stirring member to open the opening.
Figure 11B:
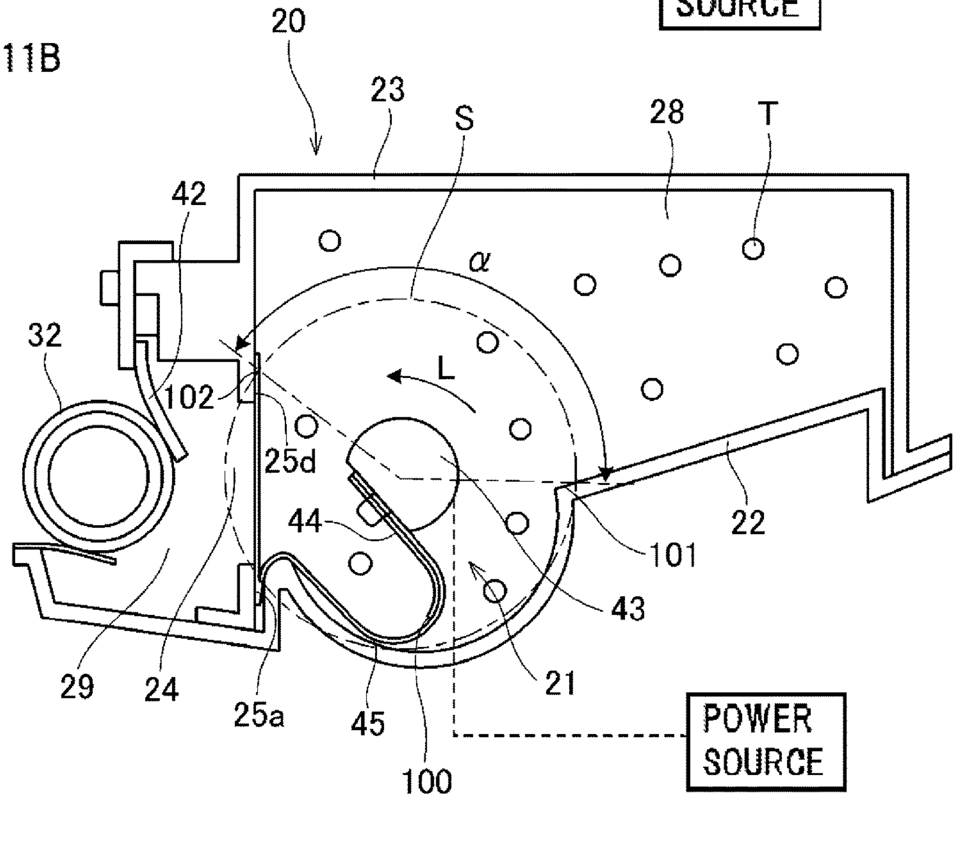

FIGS. 11A and 11B are views showing the opening operation of the developing unit in a case where the unsealing member rotates in the L direction.

As shown in FIG. 11A, when the unsealing member 43 rotates in the L direction, the latch reception portion 100 constituted by the tip end of the stirring member 44 contacts the second latch portion 102. The second latch portion 102, similarly to the first latch portion, is formed to overlap the rotation locus S of the latch reception portion 100. When the latch reception portion 100 contacts the second latch portion 102, and no driving force is being supplied to the unsealing member 43 from the drive source attached to the apparatus main body A, rotation of the unsealing member 43 is regulated. When driving force is being supplied to the unsealing member 43 from the driving source, on the other hand, the unsealing member 43 is allowed to rotate.

When the unsealing member 43 is allowed to rotate, the unsealing member 43 continues to rotate such that the latch reception portion 100 overruns the second latch portion 102. Thereafter, as shown in FIG. 11B, the slack of the sealing member 45 gradually disappears so that as the unsealing member 43 continues to rotate, the sealing member 45 is gradually peeled away in a similar manner to a case in which the unsealing member 43 rotates in the K direction.

Here, when torque generated in the unsealing member 43 as the sealing member 45 is peeled away in a case where the unsealing member 43 rotates in the K direction is set as opening torque T2, a relationship of T1>T2 is established. As described above, T1 is the overrun torque T1 generated when the latch reception portion 100 overruns the first latch portion 101. In the first embodiment, the relationship of T1>T2 must be established to ensure that peeling away of the sealing member 45 is regulated by the first latch portion 101.

Further, in a case where the unsealing member 43 rotates in the L direction, torque generated when the latch reception portion 100 overruns the second latch portion 102 is set as overrun torque T3 (not shown), while torque generated in the unsealing member 43 as the sealing member 45 is peeled away is set as opening torque T4 (not shown). At this time, a relationship of T3>T4 must be established between the overrun torque T3 and the opening torque T4.

Second Embodiment

Next, a developer storage unit according to a second embodiment will be described using FIG. 12. Note that in the second embodiment, parts having identical functions to the first embodiment have been allocated identical reference symbols, and description thereof has been omitted.

Figure 12:
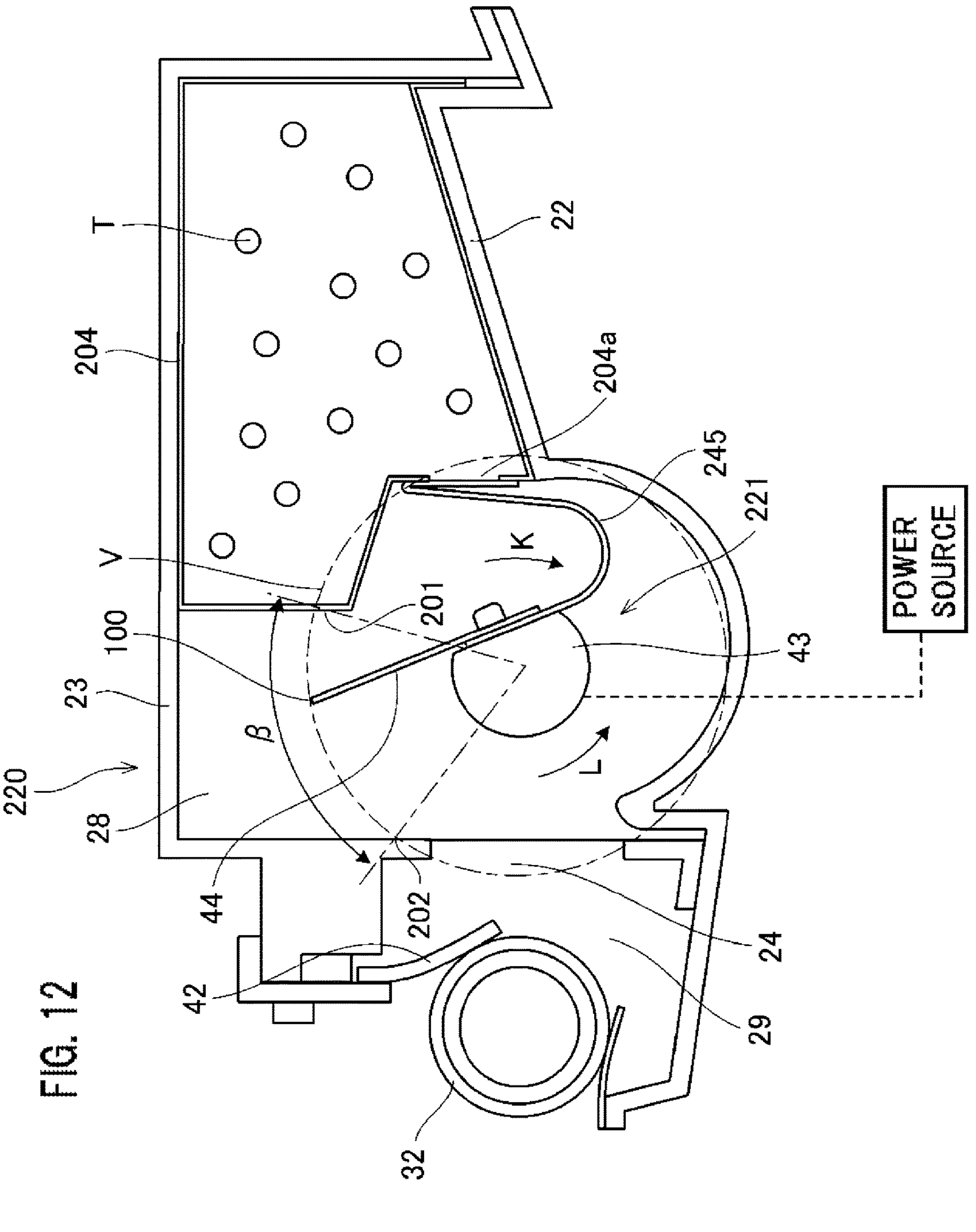
FIG. 12 is a sectional view showing a configuration of a developer storage unit according to a second embodiment.

FIG. 12 is a sectional view showing a developer storage unit 220 in a fully assembled condition. In the second embodiment, a flexible container 204 is disposed inside the toner storage chamber 28, and rotation of the unsealing member 43 is regulated by a first latch portion 201 provided on the flexible container 204 and a second latch portion 202 provided on the developer container 23.

In the second embodiment, the flexible container 204 filled with the toner T is housed in the toner storage chamber 28 (i.e. in a frame) so that the toner T in the toner storage chamber 28 (corresponding to the frame) is replenished indirectly. As a result, the developer can be prevented from scattering during the developer charging process executed when manufacturing the process cartridge.

The developer storage unit 220 includes the toner storage chamber 28, the unsealing member 43, the stirring member 44, a sealing member 245, and the flexible container 204. The unsealing member 43, the stirring member 44, the sealing member 245, and the flexible container 204 are disposed inside the toner storage chamber 28. The flexible container 204 includes an opening 204*a* through which the toner T is discharged, and the toner T is stored therein. The sealing member 245 seals the opening 204*a* formed in the flexible container 204. The unsealing member 43 is disposed in an interior of the toner storage chamber 28 but on an exterior of the flexible container 204, and a part of the sealing member 245 is attached thereto. Further, the unsealing member 43 rotates upon reception of driving power from the driving power source. Note that a space in the interior of the toner storage chamber 28 but on the exterior of the flexible container 204 corresponds to a developer storage portion.

The sealing member 245 seals the opening 204*a* by being adhered to the flexible container 204. There are no limitations on a method of adhering the sealing member 245, and thermal welding, laser welding, an adhesive, double-sided tape, and so on may be used. Note that the flexible container 204 is formed by subjecting a sheet-form material to vacuum molding, pressure molding, or press molding. The flexible container 204 is formed to be less rigid than the bottom member 22 and the developer container 23.

The flexible container 204 is disposed in the toner storage chamber 28 such that a space in which to dispose the unsealing member unit 221 is secured, and the unsealing member unit 221 is disposed in this space. In other words, the unsealing member unit 221 is disposed on the exterior of the flexible container 204 (corresponding to an outer side of a flexible container) and in the interior of the toner storage chamber 28.

The unsealing member unit 221 includes the unsealing member 43, the stirring member 44, and the sealing member 245, one end of the stirring member 44 being attached to the unsealing member 43. The sealing member 245 is attached at one end to the unsealing member 43 such that when the unsealing member 43 rotates, the sealing member 245 is wound around the unsealing member 43. Similarly to the first embodiment, the stirring member 44 is flexible. Also similarly to the first embodiment, the unsealing member 43 rotates upon reception of driving power from the driving power source attached to the apparatus main body A.

Similarly to the first embodiment, when the unsealing member 43 rotates in the K direction or the L direction, the latch reception portion 100 constituted by the tip end of the stirring member 44 moves along the rotation locus S. Further, the first latch portion 201 is formed on an outer wall (a wall portion) of the flexible container 204, and the second latch portion 202 is formed on the inner wall (the wall portion) of the developer container 23. The first latch portion 201 and the second latch portion 202 are formed to overlap the rotation locus S such that when the unsealing member 43 rotates in the K direction, the latch reception portion 100 contacts the first latch portion 201, and when the unsealing member 43 rotates in the L direction, the latch reception portion 100 contacts the second latch portion 202.

When rotation of the unsealing member 43 is regulated by the first latch portion 201 and the second latch portion 202, rotation of the unsealing member 43 is regulated in both the K direction and the L direction so that the unsealing member 43 is capable of moving only within a range of an angle β. In the second embodiment, similarly to the first embodiment, the first latch portion 201 and the second latch portion 202 are provided to allow the unsealing member 43 to rotate when the unsealing member 43 is rotated by driving power from the driving power source attached to the apparatus main body A. As a result, the unsealing member 43 can be allowed to rotate when rotated by driving power from the driving power source while preventing the unsealing member 43 from rotating against the wishes of the user.

Here, when the unsealing member 43 rotates such that the sealing member 245 is peeled away, the toner T flows out of the flexible container 204 through the opening 204*a*. The toner T that flows out is stirred in the developer container 23 by the rotating stirring member 44.

According to the second embodiment, as described above, the flexible container 204 filled with the toner T is provided in the toner storage chamber 28, and therefore the toner is prevented from scattering during the toner charging process. Further, the latch portion is provided on the inner wall (the wall portion) of the toner storage chamber 28 and the outer wall (the wall portion) of the flexible container 204, and therefore a situation in which the sealing member 245 is peeled away by mistake can be prevented from occurring.

Here, torque generated when the latch reception portion 100 overruns the first latch portion 201 as the unsealing member 43 rotates in the K direction is set as overrun torque T5 (not shown). Further, torque generated when the sealing member 245 is peeled away as the unsealing member 43 rotates in the K direction is set as opening torque T6 (not shown). At this time, a relationship of T5>T6 is established between the overrun torque T5 and the opening torque T6.

Furthermore, torque generated when the latch reception portion 100 overruns the second latch portion 202 as the unsealing member 43 rotates in the L direction is set as overrun torque T7 (not shown). Further, torque generated when the sealing member 245 is peeled away as the unsealing member 43 rotates in the L direction is set as opening torque T8 (not shown). At this time, a relationship of T7>T8 is established between the overrun torque T7 and the opening torque T8.

Note that the developer storage unit 220 according to the second embodiment is attached to the apparatus main body A shown in FIG. 2 as a part of the cartridge B.

Third Embodiment

Next, a developing unit according to a third embodiment will be described using FIG. 13. Note that in the third embodiment, parts having identical functions to the first embodiment have been allocated identical reference symbols, and description thereof has been omitted.

Figure 13:
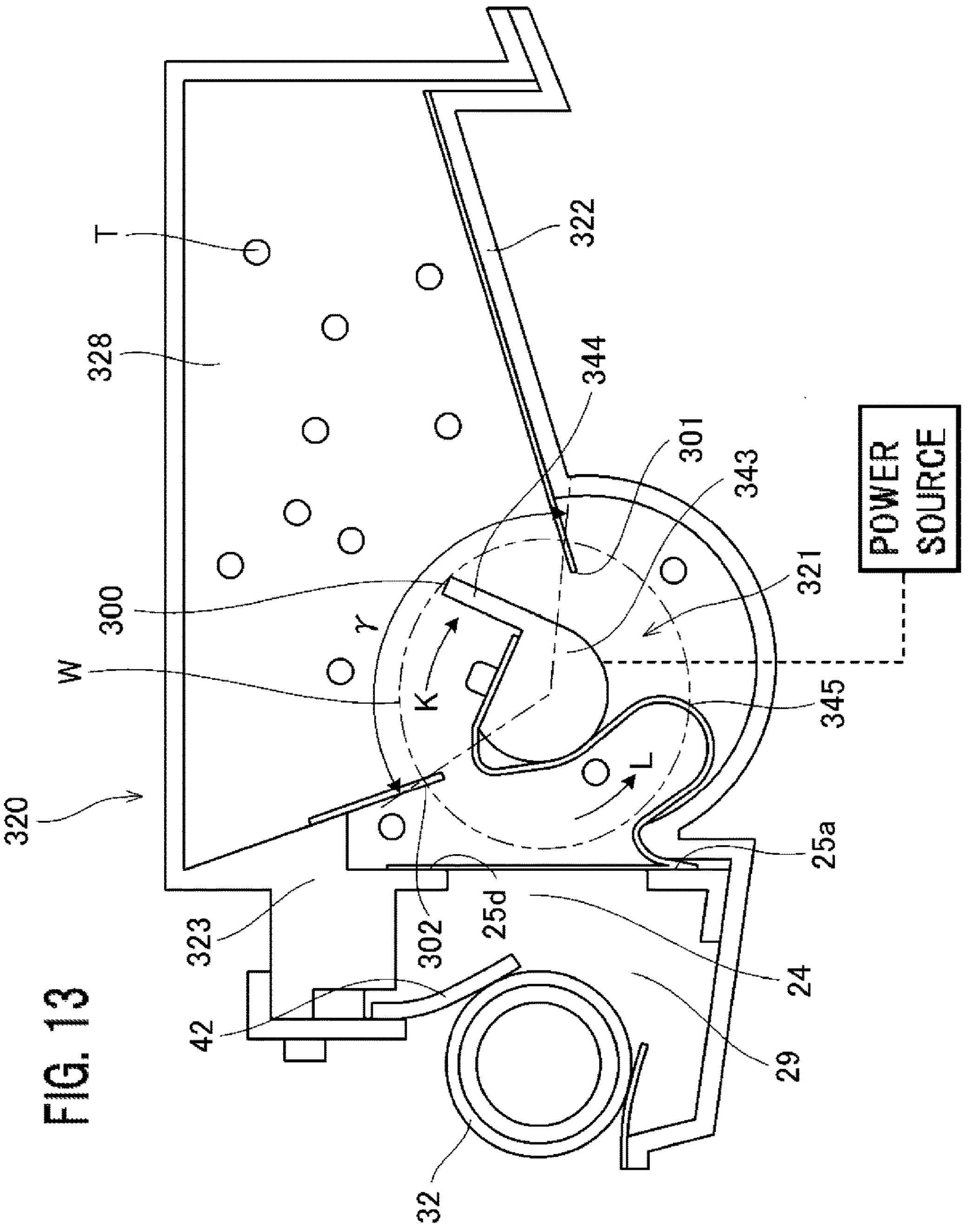
FIG. 13 is a sectional view showing a configuration of a developing unit according to a third embodiment.

FIG. 13 is a sectional view showing a developing unit 320 in a fully assembled condition. In the third embodiment, a first latch portion 301 and a second latch portion 302 are attached respectively to a developer chamber 323 and a bottom member 322 as individual members. Further, the first latch portion 301 and the second latch portion 302 are configured to be flexible.

In the third embodiment, the first latch portion 301 is fixed to the bottom member 322, and the second latch portion 302 is fixed to the developer chamber 323. The first latch portion 301 and second latch portion 302 are formed from a flexible material such as PET, PC, or PPS, and fixed to a chamber inner wall (a wall portion) of a toner storage chamber 328 by thermal welding, laser welding, an adhesive, double-sided tape, or the like.

The developing unit 320 also includes an unsealing member unit 321 provided in the toner storage chamber 328. The unsealing member unit 321 includes an unsealing member 343, a stirring member 344, and a sealing member 345, the stirring member 344 being formed to project from the unsealing member 343. The stirring member 344 is formed to be shorter than the stirring member 44 of the first and second embodiments. Further, the sealing member 345 is attached to the unsealing member 343 so as to seal the opening 24 formed in the toner storage chamber 328.

The first latch portion 301 and second latch portion 302 regulate rotation of the unsealing member 343 using a similar method to the first and second embodiments. Here, a locus drawn by a latch reception portion 300, which is constituted by a tip end part of the stirring member 344, in a case where the first latch portion 301 and second latch portion 302 are not provided is set as a rotation locus W. The rotation locus W of the latch reception portion 300 constituted by the tip end of the stirring member 344 overlaps the first latch portion 301 and second latch portion 302 that project into the toner storage chamber 328, and therefore the latch reception portion 300 contacts the first latch portion 301 or the second latch portion 302 when the unsealing member 343 rotates. Respective ends of the first and second latch portions 301, 302 on the side that projects into the toner storage chamber 328 serve as free ends. Note that similarly to the first and second embodiments, the unsealing member 343 rotates upon reception of driving power from the driving power source attached to the apparatus main body A.

When the unsealing member 343 rotates in the K direction, rotation of the unsealing member 343 is regulated by the first latch portion 301, and when the unsealing member 343 rotates in the L direction, rotation of the unsealing member 343 is regulated by the second latch portion 302. Here, when rotation of the unsealing member 343 is regulated, rotation of the unsealing member 343 in both the K direction and the L direction is regulated so that the unsealing member 343 is capable of moving only within a range of an angle γ.

Furthermore, in the third embodiment, similarly to the first and second embodiments, the first latch portion 301 and the second latch portion 302 are provided to allow the unsealing member 343 to rotate when the unsealing member 343 is rotated by driving power from the driving power source attached to the apparatus main body A. As a result, the unsealing member 343 can be allowed to rotate when rotated by driving power from the driving power source, while regulating rotation of the unsealing member 343 against the wishes of the user.

A magnitude of the torque at which the first latch portion 301 and second latch portion 302 can regulate rotation of the unsealing member 343 is determined according to the flexibility and length of the first and second latch portions 301, 302, the length of the stirring member 344, and so on.

According to the third embodiment, as described above, the latch portion is provided on the inner wall (the wall portion) of the toner storage chamber 328, and therefore a situation in which the sealing member 345 is peeled away by mistake such that the opening 24 is opened by mistake can be prevented from occurring.

Here, torque generated when the latch reception portion 300 overruns the first latch portion 301 as the unsealing member 343 rotates in the K direction is set as overrun torque T9 (not shown). Further, torque generated when the sealing member 345 is peeled away as the unsealing member 343 rotates in the K direction is set as opening torque T10 (not shown). At this time, a relationship of T9>T10 is established between the overrun torque T9 and the opening torque T10.

Furthermore, torque generated when the latch reception portion 300 overruns the second latch portion 302 as the unsealing member 343 rotates in the L direction is set as overrun torque Ill (not shown). Further, torque generated when the sealing member 345 is peeled away as the unsealing member 343 rotates in the L direction is set as opening torque T12 (not shown). At this time, a relationship of T11>T12 is established between the overrun torque T11 and the opening torque T12.

Note that the developing unit 320 according to the third embodiment is attached to the apparatus main body A shown in FIG. 2 as a part of the cartridge B.

Configurations in which either the latch portion or the stirring member is flexible were described in the respective embodiments, but the present invention is not limited thereto, and instead, for example, the latch portion and the stirring member according to the respective embodiments may both be flexible. As long as rotation of the unsealing member is regulated when the unsealing member is rotated by any force other than the driving power from the driving power source attached to the apparatus main body A and permitted when the unsealing member is rotated by the driving power from the driving power source attached to the apparatus main body A, the flexibility of the latch portion and the stirring member may be set as desired.

Further, configurations in which the unsealing member and the stirring member are constituted by a single member were described in the respective embodiments, but the present invention is not necessarily limited thereto, and instead, for example, the unsealing member and the stirring member may be constituted by separate members and disposed in separate positions. This is effective in a case where, in accordance with the structure of the cartridge, a position to be stirred differs from a position of the unsealing member.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-176129, filed Aug. 29, 2014, which is hereby incorporated by reference herein in its entirety.

What is claimed is:

1. A sealing member provided to a developer container, the developer container comprising: a frame provided with a developer storage chamber configured to store developer and an opening for discharging the developer from the developer storage chamber; a rotatable member provided inside of the developer storage chamber and being rotatable in a first direction and a second direction opposite to the first direction; a stirring member attached to the rotatable member; and a drive transmitting member for rotating the rotatable member, the sealing member comprising:

a sealing portion attached to the frame so as to seal the opening; and an attached portion attached to the rotatable member, wherein the sealing member is disposed inside the developer storage chamber, and the sealing member is attached to the frame and the rotatable member such that, if the rotatable member rotates in the first direction, the sealing portion starts separating from the frame after the stirring member contacts a first regulating portion, and if the rotatable member rotates in the second direction the sealing portion starts separating from the frame after the stirring member contacts a second regulating portion.

2. A sealing member according to claim 1, wherein the sealing member is attached to the frame and the rotatable member such that, in a state in which a middle portion of the sealing member between the sealing portion and the attached portion slacks, the stirring member is allowed to contact the first regulating portion and the second regulating portion.

3. A sealing member according to claim 1, wherein the rotatable member comprises a projection, and wherein the sealing member is provided with a hole configured to accept the projection and the sealing member is sandwiched between the rotatable member and the stirring member.

4. A sealing member according to claim 1, wherein, when the rotatable member rotates and the sealing portion is separated from the frame, a tip end part of the sealing member is contactable to the stirring member.

5. A sealing member according to claim 4, wherein the stirring member comprises a fixed portion fixed to the rotatable member, and wherein the tip end part of the sealing member is contactable to a middle portion of the stirring member between a tip end part of the stirring member and the fixed portion.

6. A sealing member according to claim 1, wherein the developer container is attachable to an image forming apparatus comprising a driving power source for rotating the rotatable member in the first direction, and wherein the stirring member is configured to overrun the first regulating portion when the rotatable member is rotated in the first direction by the driving power source.

7. A sealing member according to claim 1, wherein at least one of a part of the frame, a sheet member fixed to the frame, and the sealing member is configured to function as the first regulating portion or the second regulating portion.

8. A developing apparatus comprising:

the sealing member according to claim 1;

the developer container comprising:

the frame;

the rotatable member;

the stirring member;

the drive transmitting member; and a developer bearing member that bears developer.

9. A process cartridge comprising:

the sealing member according to claim 1;

the developer container comprising:

the frame;

the rotatable member;

the stirring member; and the drive transmitting member, and an image bearing member that bears a developer image formed from the developer.

10. A sealing member provided to a developer container, the developer container comprising: a flexible container for storing developer and provided with an opening for discharging the developer from the flexible container; a rotatable member provided outside of the flexible container and configured to be rotatable in a first direction and a second direction opposite to the first direction; a stirring member attached to the rotatable member; a frame that accommodates the flexible container, the rotatable member, and the stirring member; and a drive transmitting member for rotating the rotatable member, the sealing member comprising:

a sealing portion attached to the flexible container so as to seal the opening; and an attached portion attached to the rotatable member, wherein, the sealing member is attached to the flexible container and the rotatable member such that, if the rotatable member rotates in the first direction, the sealing portion starts separating from the flexible container after the stirring member contacts a first regulating portion and if the rotatable member rotates in the second direction, the sealing portion starts separating from the frame after the stirring member contacts a second regulating portion.

11. A sealing member according to claim 10, wherein the sealing member is attached the flexible container and the rotatable member such that, in a state in which a middle portion of the sealing member between the sealing portion and the attached portion slacks, the stirring member is allowed to contact the first regulating portion and the second regulating portion.

12. A sealing member according to claim 10, wherein the developer container is attachable to an image forming apparatus comprising a driving power source for rotating the rotatable member in the first direction, and wherein the stirring member is configured to overrun the first regulating portion when the rotatable member is rotated in the first direction by the driving power source.

13. A sealing member according to claim 10, wherein at least one of the frame, the flexible container, a sheet member fixed to the frame, and the sealing member is configured to function as the first regulating portion or the second regulating portion.

14. A sealing member according to claim 10, wherein the rotatable member comprises a projection, and the stirring member is provided with a hole configured to accept the projection, wherein the sealing member is provided with a hole configured to accept the projection.

15. A developing unit comprising:

a developer container comprising:

a frame provided with a developer storage chamber configured to store developer and an opening for discharging the developer from the developer storage chamber;

a rotatable member provided inside of the developer storage chamber, and configured to be rotatable in a first direction and a second direction opposite to the first direction;

a stirring member attached to the rotatable member; and a drive transmitting member for rotating the rotatable member; and a sealing member provided to the developer container, the sealing member comprising:

a sealing portion attached to the frame so as to seal the opening; and an attached portion attached to the rotatable member, wherein, the sealing member is attached to the frame and the rotatable member such that, if the rotatable member rotates in the first direction, the sealing portion starts separating from the frame after the stirring member contacts the first regulating portion, and if the rotatable member rotates in the second direction, the sealing portion starts separating from the frame after the stirring member contacts a second regulating portion.

16. A developing unit according to claim 15, wherein the sealing member is attached to the frame and the rotatable member such that, in a state in which a middle portion of the sealing member between the sealing portion and the attached portion slacks, the stirring member is allowed to contact the first regulating portion and the second regulating portion.

17. A developing unit according to claim 15, wherein the rotatable member comprises a projection, and wherein the sealing member is provided with a hole configured to accept the projection and the sealing member is sandwiched between the rotatable member and the stirring member.

18. A developing unit according to claim 15, wherein, when the rotatable member rotates and the sealing portion is separated from the frame, a tip end part of the sealing member is contactable to the stirring member.

19. A developing unit according to claim 18, wherein the stirring member comprises a fixed portion fixed to the rotatable member, and wherein the tip end part of the sealing member is contactable to a middle portion of the stirring member between a tip end part of the stirring member and the fixed portion.

20. A developing unit according to claim 15, wherein the developer container is attachable to an image forming apparatus comprising a driving power source for rotating the rotatable member in the first direction, and wherein the stirring member is configured to overrun the first regulating portion when the rotatable member is rotated in the first direction by the driving power source.

21. A developing unit according to claim 15, wherein at least one of a part of the frame, a sheet member fixed to the frame, and the sealing member is configured to function as the first regulating portion or the second regulating portion.

22. A process cartridge comprising:

the sealing member according to claim 15;

the developer container comprising:

the flexible container;

the rotatable member;

the stirring member;

the frame; and the drive transmitting member, and a developer bearing member that bears developer; and an image bearing member that bears a developer image formed from the developer.

23. A developing unit comprising:

a developer container comprising:

a flexible container for storing developer and provided with an opening for discharging the developer from the flexible container;

a rotatable member provided outside of the flexible container and configured to be rotatable in a first direction and a second direction opposite to the first direction;

a stirring member attached to the rotatable member;

a frame that accommodates the flexible container, the rotatable member, and the stirring member; and a drive transmitting member for rotating the rotatable member; and a sealing member provided to the developer container, the sealing member comprising:

a sealing portion attached to the flexible container so as to seal the opening; and an attached portion attached to the rotatable member, wherein, the sealing member is attached to the flexible container and the rotatable member such that, if the rotatable member rotates in the first direction, the sealing portion starts separating from the flexible container after the stirring member contacts a first regulating portion and if the rotatable member rotates in the second direction, the sealing portion starts separating from the flexible container after the stirring member contacts a second regulating portion.

24. A developing unit according to claim 23, wherein the sealing member is attached to the flexible container and the rotatable member such that in a state in which a middle portion of the sealing member between the sealing portion and the attached portion slacks, the stirring member allowed to contact the first regulating portion and the second regulating portion.

25. A developing unit according to claim 23, wherein the developer container is attachable to an image forming apparatus comprising a driving power source for rotating the rotatable member in the first direction, and wherein the stirring member is configured to overrun the regulating portion when the rotatable member is rotated in the first direction by the driving power source.

26. A developing unit according to claim 23, wherein at least one of the frame, the flexible container, a sheet member fixed to the frame, and the sealing member is configured to function as the first regulating portion or the second regulating portion.

27. A sealing member according to claim 23, wherein the rotatable member comprises a projection, and the stirring member is provided with a hole configured to accept the projection, wherein the sealing member is provided with a hole configured to accept the projection.

* * * * *